(12) United States Patent
Shi

(10) Patent No.: US 10,164,622 B2
(45) Date of Patent: Dec. 25, 2018

(54) CIRCUIT AND METHOD FOR REDUCING MISMATCH FOR COMBINED CLOCK SIGNAL

(71) Applicant: Montage Technology (Shanghai) Co., Ltd., Shanghai (CN)

(72) Inventor: Mingfu Shi, Shanghai (CN)

(73) Assignee: MONTAGE TECHNOLOGY (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 15/219,092

(22) Filed: Jul. 25, 2016

(65) Prior Publication Data
US 2018/0006635 A1   Jan. 4, 2018

(30) Foreign Application Priority Data

Jun. 29, 2016 (CN) .......................... 2016 1 0496237

(51) Int. Cl.
| | | |
|---|---|---|
| H04B 1/10 | (2006.01) |
| H03L 7/06 | (2006.01) |
| G01R 31/3187 | (2006.01) |
| B60T 8/88 | (2006.01) |
| H03L 7/081 | (2006.01) |
| H03L 7/093 | (2006.01) |
| G09G 3/36 | (2006.01) |
| H03K 5/1534 | (2006.01) |
| H03K 5/15 | (2006.01) |
| H03K 5/00 | (2006.01) |

(52) U.S. Cl.
CPC ....... *H03K 5/1534* (2013.01); *H03K 5/15066* (2013.01); *H03K 2005/00071* (2013.01)

(58) Field of Classification Search
CPC .... H03K 5/1534; H03K 5/15066; H03L 7/06; H04B 1/10
USPC .............. 327/2–12, 105–123, 141, 144–163; 331/15–17; 375/373–376
See application file for complete search history.

(56) References Cited

U.S. PATENT DOCUMENTS

| | | | | |
|---|---|---|---|---|
| 5,404,304 A * | 4/1995 | Wise | ....................... | B60T 8/172 303/122.08 |
| 5,459,732 A * | 10/1995 | Wise | ....................... | B60T 8/885 701/76 |
| 5,600,548 A * | 2/1997 | Nguyen | .................. | H02M 7/48 363/41 |
| 8,400,197 B2 | 3/2013 | Romano et al. | | |
| 8,872,691 B1 * | 10/2014 | Stepanovic | ............. | H03M 1/06 341/144 |

(Continued)

*Primary Examiner* — Brandon S Cole
(74) *Attorney, Agent, or Firm* — Oliff PLC

(57) ABSTRACT

A circuit comprises a cycle-cycle detector, configured to receive a synthesized clock signal, and detect a cycle difference index signal between any two neighboring cycles of the synthesized clock signal, wherein the synthesized clock signal is combined by a plurality of phase shifted signals; a demultiplexer connected to the cycle-cycle detector, configured to convert the cycle difference index signal into a plurality of parallel data signals; and a first state machine, connected to both the demultiplexer and the cycle-cycle detector, configured to generate a tuning signal based on the parallel data signals, and feed the tuning signal back to the cycle-cycle detector; wherein the cycle-cycle detector is further configured to adjust delay time of the synthesized clock signal according to the tuning signal.

15 Claims, 20 Drawing Sheets

(56) References Cited

U.S. PATENT DOCUMENTS

| | | | |
|---|---|---|---|
| 9,698,798 B1* | 7/2017 | Fredenburg | H03L 7/0814 |
| 2003/0132907 A1* | 7/2003 | Lee | G09G 3/3685 |
| | | | 345/98 |
| 2009/0279591 A1* | 11/2009 | Filipovic | H04B 1/1036 |
| | | | 375/148 |
| 2010/0097087 A1* | 4/2010 | Hogeboom | G01R 31/31711 |
| | | | 324/750.3 |
| 2011/0273210 A1* | 11/2011 | Nagaraj | H03L 7/0802 |
| | | | 327/159 |
| 2012/0207246 A1* | 8/2012 | Song | H04L 27/2338 |
| | | | 375/329 |

* cited by examiner

US 10,164,622 B2

CIRCUIT AND METHOD FOR REDUCING MISMATCH FOR COMBINED CLOCK SIGNAL

CROSS REFERENCE TO RELATED APPLICATION

This application claims priority to Chinese application No. 201610496237.2 entitled "Circuit and method for reducing mismatch for combined clock signal," filed on Jun. 29, 2016 by Montage Technology (Shanghai) Co., Ltd., which is incorporated herein by reference.

TECHNICAL FIELD

The present invention relates to analog and digital mixed circuit, and more particularly, but not limited to circuit and method for reducing mismatch for combined clock signal.

BACKGROUND

For a clock signal combined or synthesized from multiple-phase signals, as there are mismatches among different input phase paths, the synthesized clock signal may have spurs or jitters.

A conventional solution to reduce or eliminate mismatch is to decompose the synthesized clock signal by a frequency divider, to output new plurality of phase shifted signals, and test the duty cycle of each of the plurality of phase shifted signals, therefore adjusting mismatch of the input signals. However, such method will introduce additional mismatch, such as an offset of comparator or resolution of analog-digital converter (ADC) used to detect clock's mismatch.

SUMMARY

According to an embodiment of the invention, a circuit comprises a cycle-cycle detector, comprising a digital-time converter configured to receive a synthesized clock signal and generate a delayed clock signal according to a tuning signal; a first DFF connected to the digital-time converter, and configured to detect a cycle difference index signal between any two neighboring cycles of the synthesized clock signal according to the delayed clock signal, wherein the synthesized clock signal is combined by a plurality of phase shifted signals, and the cycle difference index signal indicates difference between two neighboring cycles for the synthesized clock signal; a demultiplexer connected to the cycle-cycle detector, configured to convert the cycle difference index signal into a plurality of parallel data signals; and a first state machine, connected to both the demultiplexer and the cycle-cycle detector, configured to generate a tuning signal based on the parallel data signals, and feed the tuning signal back to the cycle-cycle detector; wherein the cycle-cycle detector is further configured to adjust delay time of the synthesized clock signal according to the tuning signal.

According to another embodiment of the invention, a method, comprises receiving, by a cycle-cycle detector, a synthesized clock signal; detecting, by the cycle-cycle detector, a cycle difference index signal between any two neighboring cycles of the synthesized clock signal, wherein the synthesized clock signal is combined by a plurality of phase shifted signals; converting, by a Demultiplexer, the cycle difference index signal into a plurality of parallel data signals; and generating, by a first state machine, a tuning signal based on the parallel data signals, and feed the tuning signal back to the cycle-cycle detector; adjusting, by the cycle-cycle detector, a delay time of the synthesized clock signal according to the tuning signal.

DESCRIPTION OF THE DRAWINGS

The present invention is illustrated in an exemplary manner by the accompanying drawings. The drawings should be understood as exemplary rather than limiting, as the scope of the invention is defined by the claims. In the drawings, the identical reference signs represent the same elements.

DETAILED DESCRIPTION

Various aspects and examples of the invention will now be described. The following description provides specific details for a thorough understanding and enabling description of these examples. Those skilled in the art will understand, however, that the invention may be practiced without many of these details. Additionally, some well-known structures or functions may not be shown or described in detail, so as to avoid unnecessarily obscuring the relevant description.

Figure 1A:
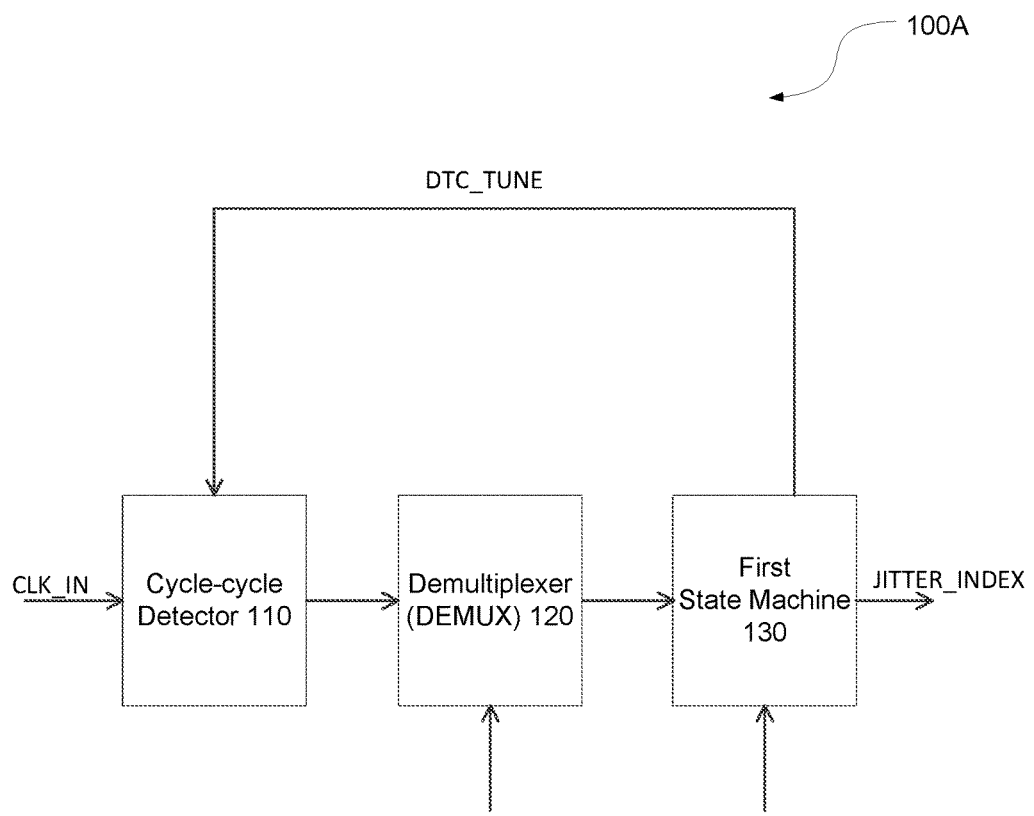
FIG. 1A is a block diagram illustrating a circuit for jitter detection according to an embodiment of the invention.
Figure 1:
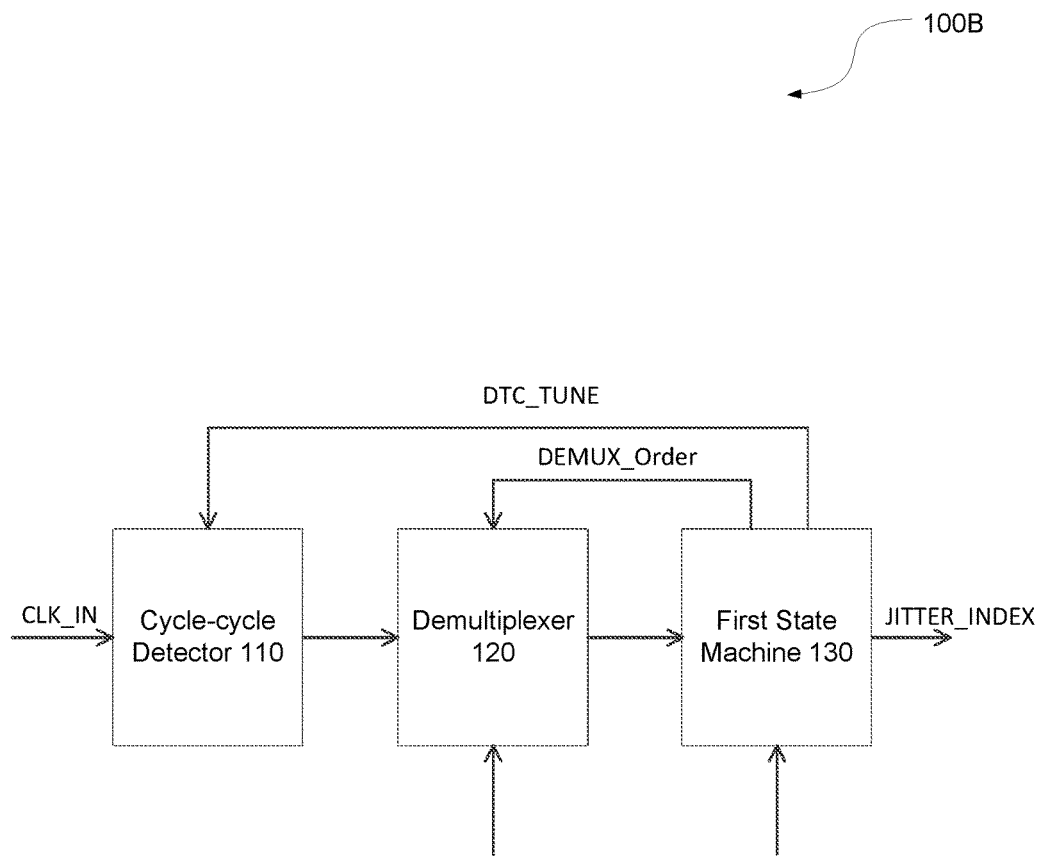
FIG. 1B is a block diagram illustrating a circuit for jitter detection according to another embodiment of the invention.

FIG. 1A is a block diagram illustrating a circuit 100A for jitter detection according to an embodiment of the invention.

The circuit 100A comprises a cycle-cycle detector 110, a demultiplexer (DEMUX) 120 and a first state machine 130.

The cycle-cycle detector 110 receives a synthesized clock signal CLK_IN, and detects a cycle difference index signal between any two neighboring cycles of the synthesized clock signal. The synthesized clock signal is combined by a plurality of phase shifted signals. Cycle-cycle, or cycle to cycle, means that a comparison between two neighboring cycles. Note as the clock signal CLK_IN is a synthesized signal, the cycle period of different cycles of the clock signal CLK_IN may be different. The cycle periods can be represented as T0, T1, T2 . . . and discussed in detail in FIG. 8. The cycle difference is measured and calculated by increasing delay time, step by step, of a digital-time converter (DTC) in the cycle-cycle detector. That is, the cycle difference can be represented by DTC's control word. The cycle difference index signal represents a time difference between any two neighboring cycles of the synthesized clock signal. Thus, a cycle difference between any two neighboring cycles may refer to time difference between T1 and T2, or T1-T2, time difference between T2 and T3, or T2–T3 . . . or time difference between $T_r$ and $T_{r+1}$, or $T_r$–$T_{r+1}$, wherein r+1 is smaller than or equal to the count (N) of paths of a plurality of phase shifted signals.

The demultiplexer 120 is connected to the cycle-cycle detector 110. The demultiplexer 120 converts the cycle difference index signal into a plurality of parallel data signals.

The first state machine 130 is connected to both the demultiplexer 120 and the cycle-cycle detector 110. The first state machine 130 generates a tuning signal DTC_TUNE based on the parallel data signals, and feeds the tuning signal DTC_TUNE back to the cycle-cycle detector 110. The tuning signal DTC_TUNE is to tune DTC's delay time in the cycle-cycle detector 110.

The cycle-cycle detector 110 further adjusts delay time of the synthesized clock signal according to the tuning signal DTC_TUNE and the first state machine 130 outputs a jitter index signal JITTER_INDEX.

FIG. 1B is a block diagram illustrating a circuit 100B for jitter detection according to another embodiment of the invention.

In FIG. 1B, the first state machine 130 further generates an order signal DEMUX_Order based on the parallel data signals; and the demultiplexer 120 further regulates the plurality of parallel data signals' sequence according to the order signal. The regulation of sequence for parallel data signals are related to the input of state machine. The DEMUX_Order signal regulates sequence of outputs of the demultiplexer 120.

Figure 2A:
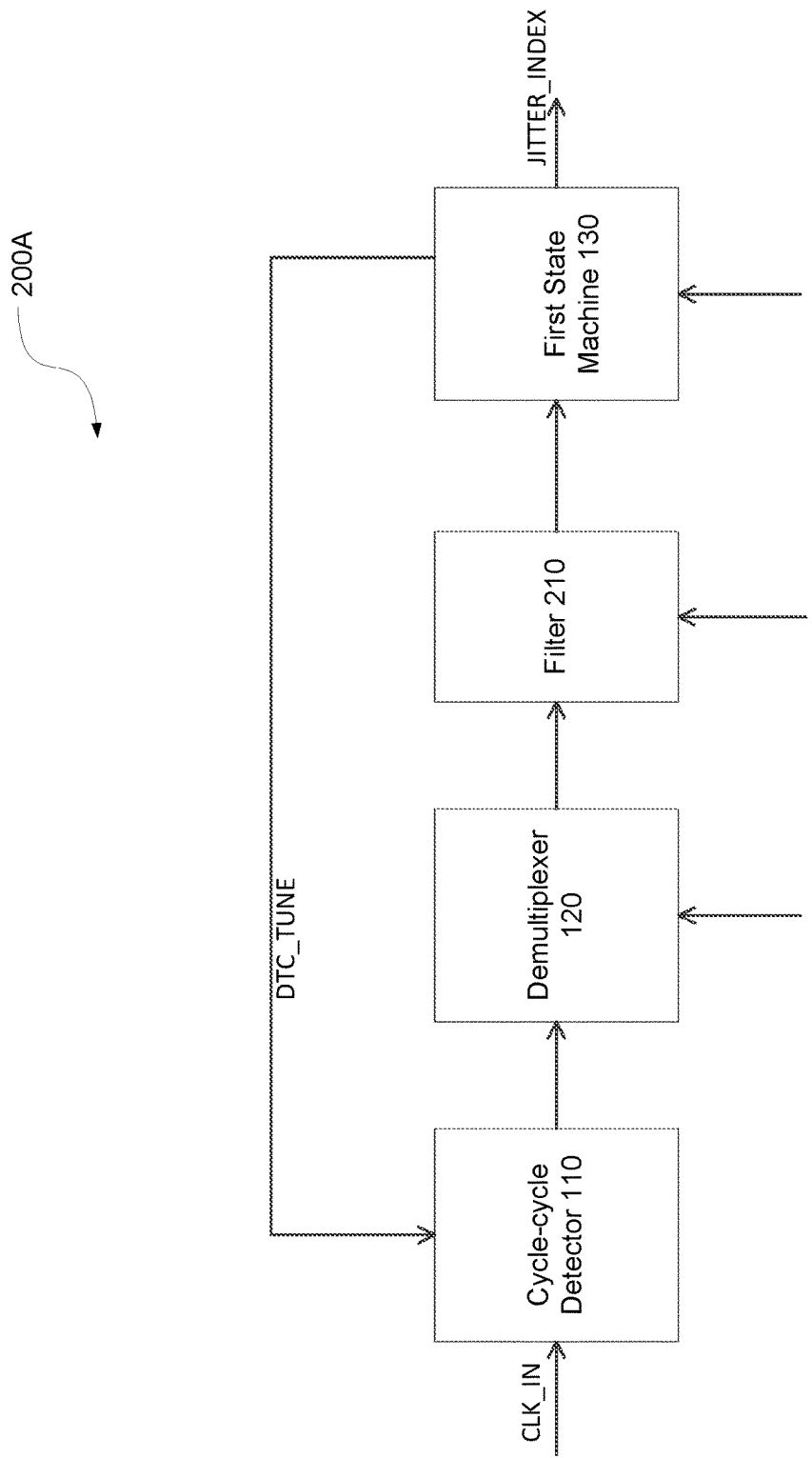
FIG. 2A is a block diagram illustrating a circuit for jitter detection according to another embodiment of the invention.

FIG. 2A is a block diagram illustrating a circuit 200A for jitter detection according to another embodiment of the invention.

In addition to the cycle-cycle detector 110 and the demultiplexer 120 already discussed with respect to FIG. 1A, the circuit 200A further comprises a filter 210 connected between the demultiplexer 120 and the first state machine 130, and configured to filter the plurality of parallel data signals. The filter 210 averages a plurality cycles of the output of the demultiplexer 120, and determines a filtered parallel data signal according to the statistical average. For example, if more than 50% cycles that the filter 210 receives have a data value of 1, the filter 210 determines the filtered parallel data signal as 1, otherwise, the value is determined as 0.

The first state machine 130 further generates the tuning signal based on the filtered parallel data signals, and feeds the tuning signal back to the cycle-cycle detector 110.

Figure 2B:
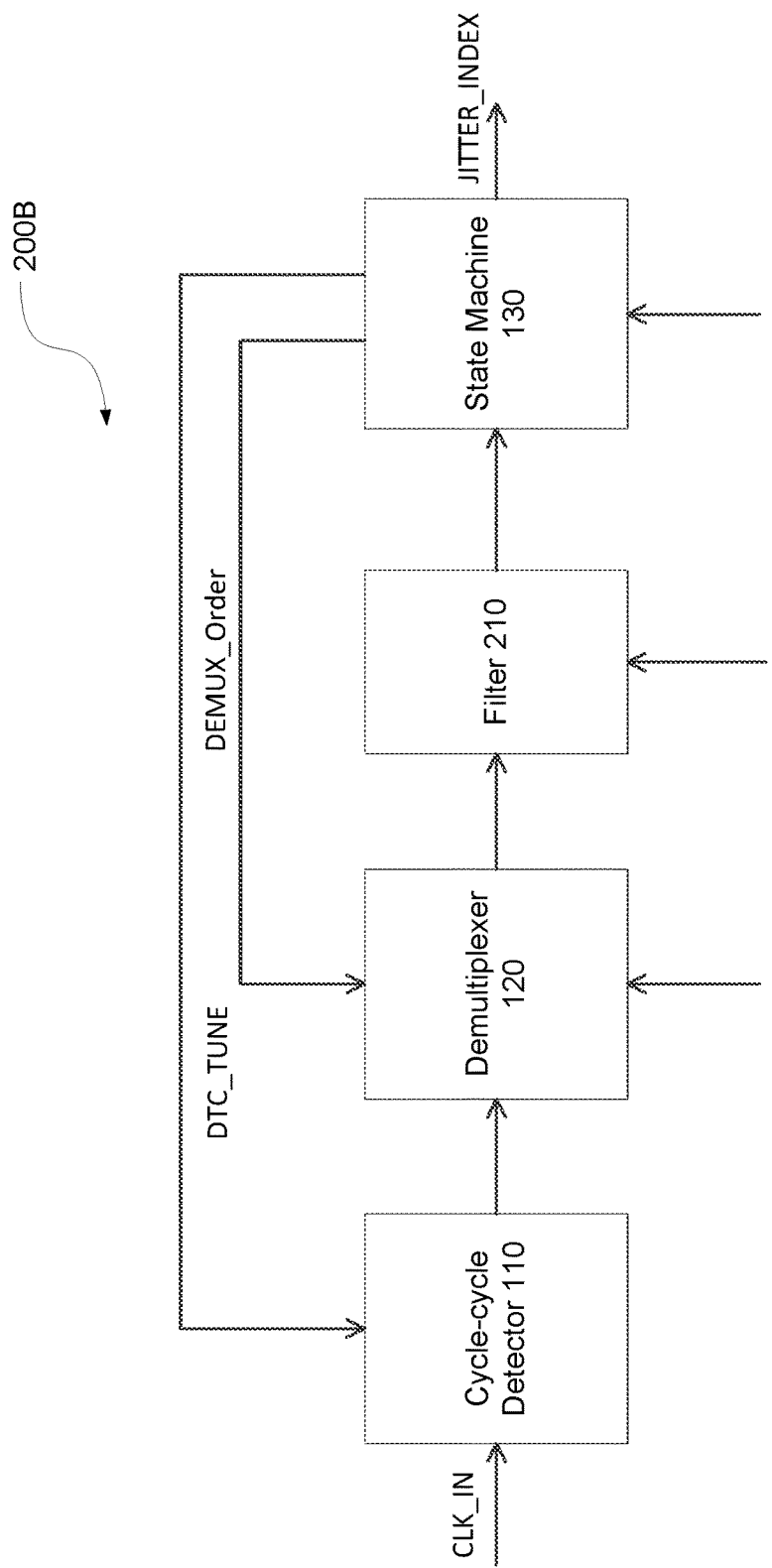
FIG. 2B is a block diagram illustrating a circuit for jitter detection according to another embodiment of the invention.

FIG. 2B is a block diagram illustrating a circuit 200B for jitter detection according to another embodiment of the invention. The circuit 200B is similar to circuit 200A shown in FIG. 2A, except that the state machine 130 in FIG. 2B further feeds an order signal DEMUX_Order back to the demultiplexer 120.

Figure 3:
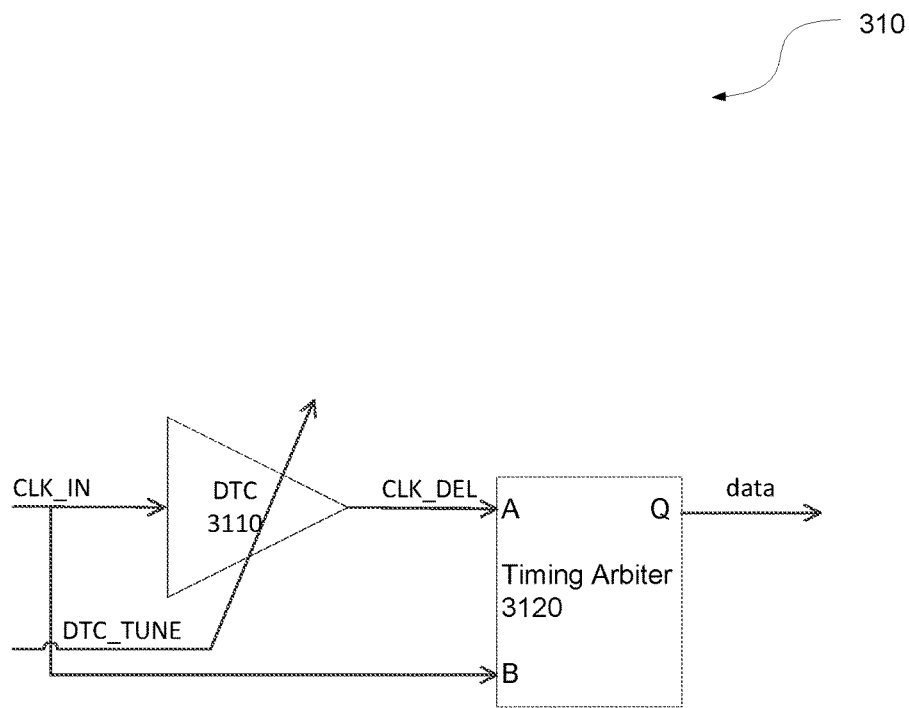
FIG. 3 is a circuit diagram illustrating a cycle-cycle detector according to an embodiment of the invention.

FIG. 3 is a circuit diagram illustrating the cycle-cycle detector 310 according to an embodiment of the invention. As shown in FIG. 3, the cycle-cycle detector 310 further comprises a digital time converter (DTC) 3110 and a timing arbiter 3120.

The digital time converter 3110 generates a delayed clock signal CLK_DEL by regulating the synthesized clock signal CLK_IN with the tuning signal DTC_TUNE. In other words, the timing arbiter 3120 receives the synthesized clock signal CLK_IN by a first input port and the delayed clock signal CLK_DEL by a second input port, and generates the cycle difference index signal, which is represented as 'data' in FIGS. 3-5B. The cycle difference index signal indicates difference between two neighboring cycles for the synthesized clock signal. For example, the timing arbiter 3120 can judge whether CLK_IN's rising edge aligns with CLK_DEL's rising edge, in other words, the size relationship between the synthesized clock signal and the delayed clock signal, and outputs the result as 'data.'

Figure 3A:
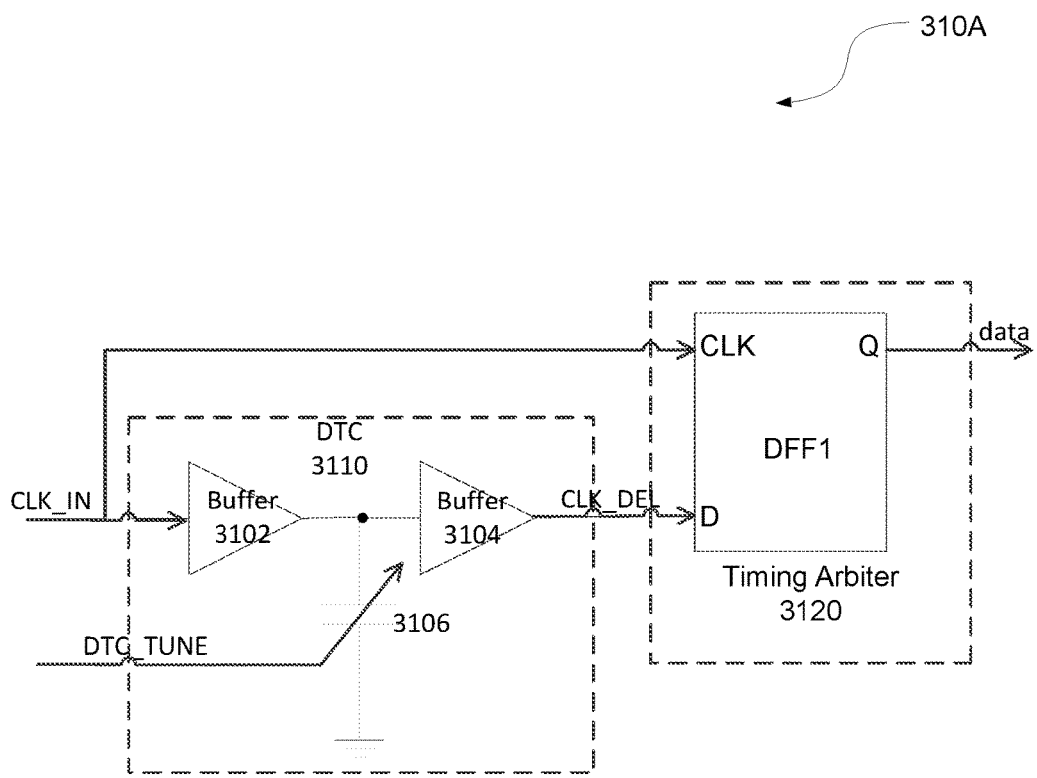
FIG. 3A is a circuit diagram illustrating a cycle-cycle detector according to another embodiment of the invention.

FIG. 3A is a circuit diagram illustrating detailed components within a cycle-cycle detector 310A according to another embodiment of the invention.

As shown in FIG. 3A, the digital time converter 3110 comprises a first buffer 3102, a second buffer 3104 and a variable capacitor 3106. The first buffer 3102 is connected to both the second buffer 3104 and the variable capacitor 3106, and configured to receive the synthesized clock signal CLK_IN. The second buffer 3104 is configured to output the delayed clock signal CLK_DEL. The delayed clock signal CLK_DEL is obtained by filtering, by the variable capacitor 3106 using the tuning signal DTC_TUNE, a buffered signal outputted by the first buffer 3102. Each buffer 3102, to be specific, has output impedance. The buffer 3102 and the digitally-controlled capacitor 3106 form a first—order low-pass filter (LPF), or a RC circuit. Changing the value of DTC_TUNE can change the capacitance value, so as to change the RC time constant, therefore generating a delayed clock signal CLK_DEL with a certain delay time. The DTC_TUNE can take the value of n0, n1, n2, which are digital control bits that characterize the size of the capacitor, the amount of the delay time, and the phase information for the delayed clock signal CLK_DEL.

As shown in FIG. 3A, the timing arbiter 3120 further comprises a first D-type flip flop (DFF). A clock (CLK) port of the first DFF (DFF1) is configured to receive the synthesized clock signal CLK_IN, a D port of the first DFF (DFF1) is configured to receive the delayed clock signal CLK_DEL, and a Q port of the first DFF (DFF1) is configured to output the cycle difference index signal as 'data'.

Figure 3B:
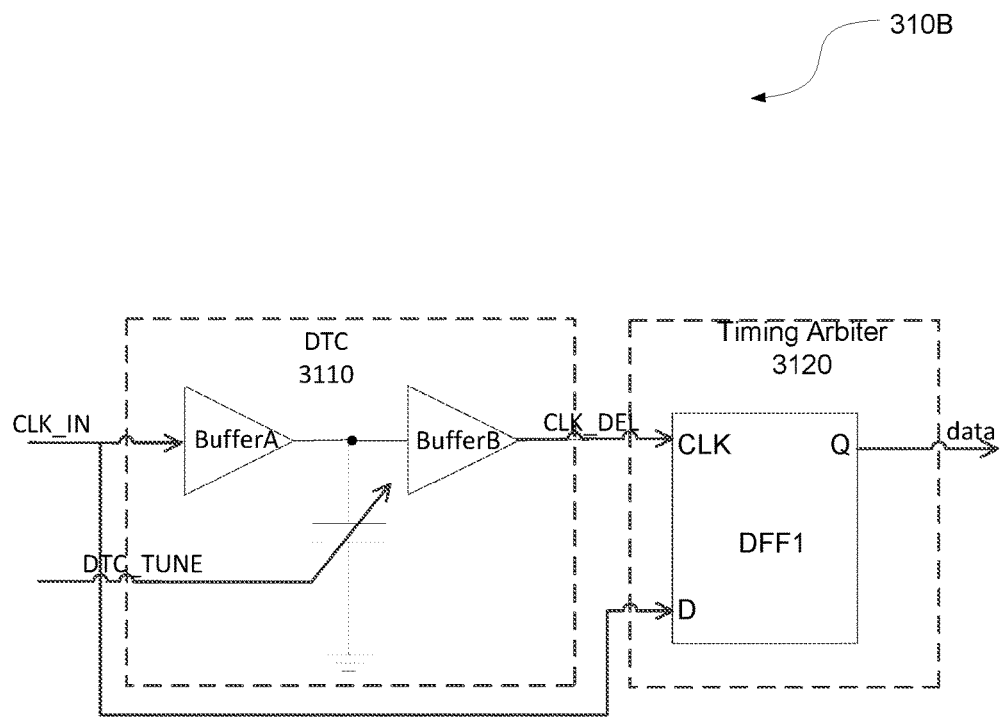
FIG. 3B is a circuit diagram illustrating a cycle-cycle detector according to another embodiment of the invention.

FIG. 3B is a circuit diagram illustrating a cycle-cycle detector 310B according to another embodiment of the invention. Compared with FIG. 3A, FIG. 3B shows another connection relationship between DTC 3110 and the timing arbiter 3120. As shown in FIG. 3B, the timing arbiter 3120 further comprises a first D-type flip flop (DFF). A CLK port of the first DFF (DFF1) is configured to receive the delayed clock signal CLK_DEL, a D port of the first DFF (DFF1) is configured to receive the synthesized clock signal CLK_IN, and a Q port of the first DFF (DFF1) is configured to output the cycle difference index signal as 'data'.

Figure 4A:
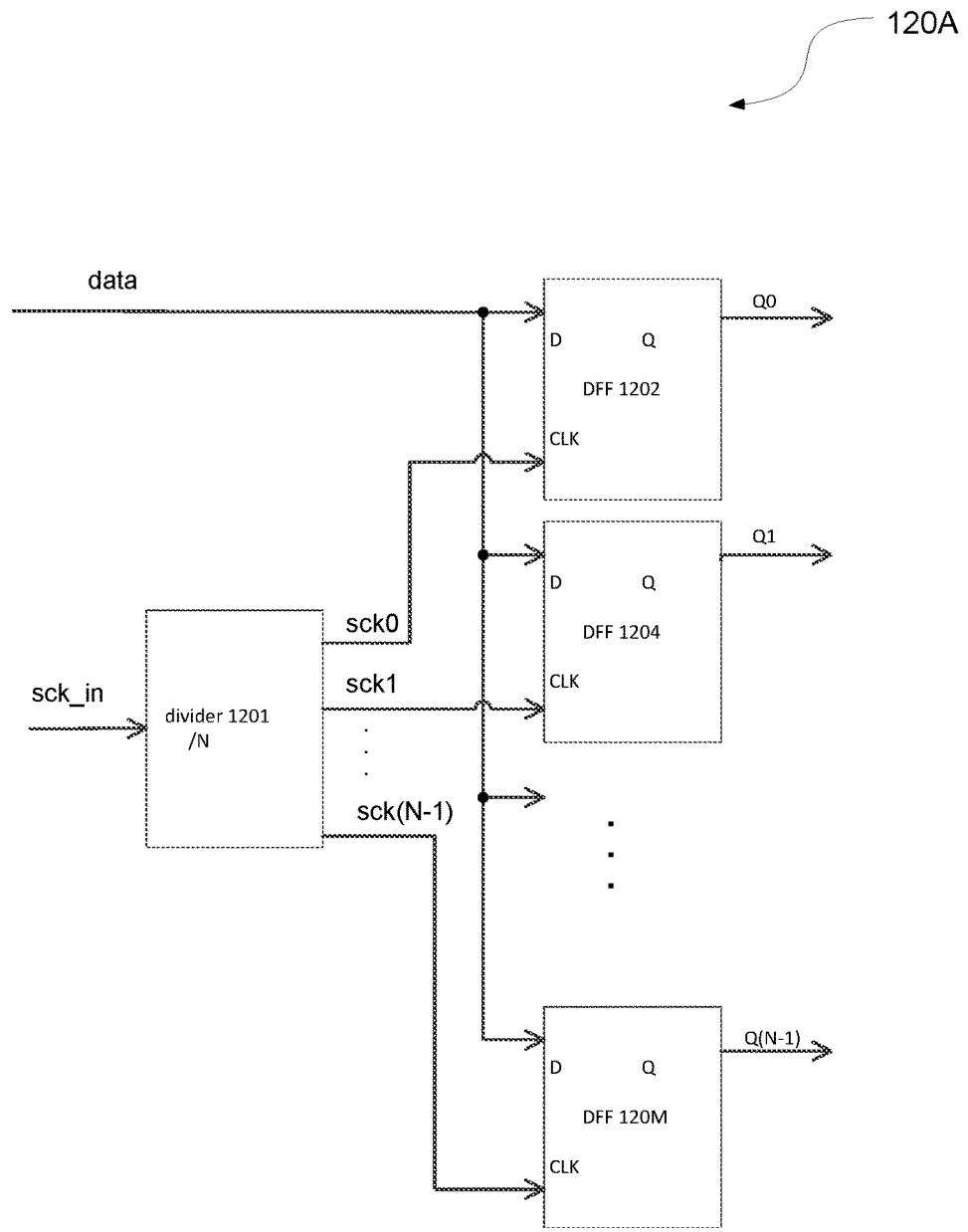
FIG. 4A is a circuit diagram illustrating a demultiplexer according to an embodiment of the invention.

FIG. 4A is a circuit diagram illustrating the demultiplexer 120A according to an embodiment of the invention.

As shown in FIG. 4A, the demultiplexer 120A comprises a divider 1201 and a plurality of second DFFs 1202, 1204 . . . 120M, wherein M=2N, and N represents the frequency division ratio of the divider 1201. Further, the cycle difference index signal comprises a plurality of bits.

The divider 1201 is configured to divide a received synthesizer clock signal sck_in into a plurality of synthesizer clock components sck0, sck1, . . . sck (N−1). Each of the plurality of synthesizer clock components sck0, sck1, . . . sck (N−1) is output into a clock port CLK of a corresponding second DFFs DFF 1202, DFF 1204, . . . DFF 120M. The synthesizer clock sck_in may be CLK_IN, CLK_DEL, or a clock signal related to both CLK_IN and CLK_DEL, or be set by the user.

A D port of each of the plurality of second DFFs DFFs DFF 1202, DFF 1204, . . . DFF 120M is configured to receive a corresponding bit of the cycle difference index signal. A Q port of each of the plurality of second DFFs DFFs DFF 1202, DFF 1204, . . . DFF 120M is configured to output a corresponding bit of the parallel data signals based on inputs of D port and clock port CLK.

Figure 4B:
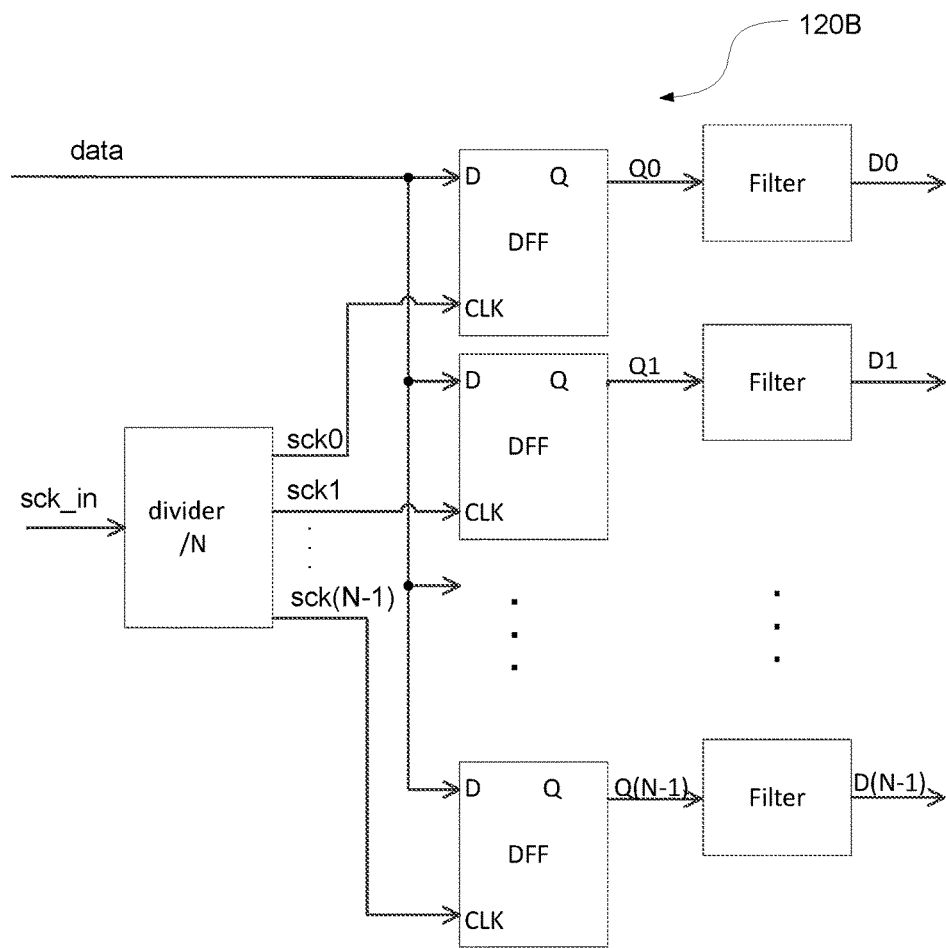
FIG. 4B is a circuit diagram illustrating a demultiplexer according to another embodiment of the invention.

Although FIGS. 2A and 2B show that the plurality of filters are separated from the demultiplexer 120B and the first state machine 130, those skilled in the art can appreciate that the plurality of filters can be incorporated into the demultiplexer. For example, FIG. 4B is a circuit diagram illustrating that the plurality of filters are incorporated into the demultiplexer 120B according to another embodiment of the invention. The plurality of filters are connected to the corresponding DFFs, respectively. Alternatively, the plurality of filters can be incorporated into the first state machine 130.

Figure 5A:
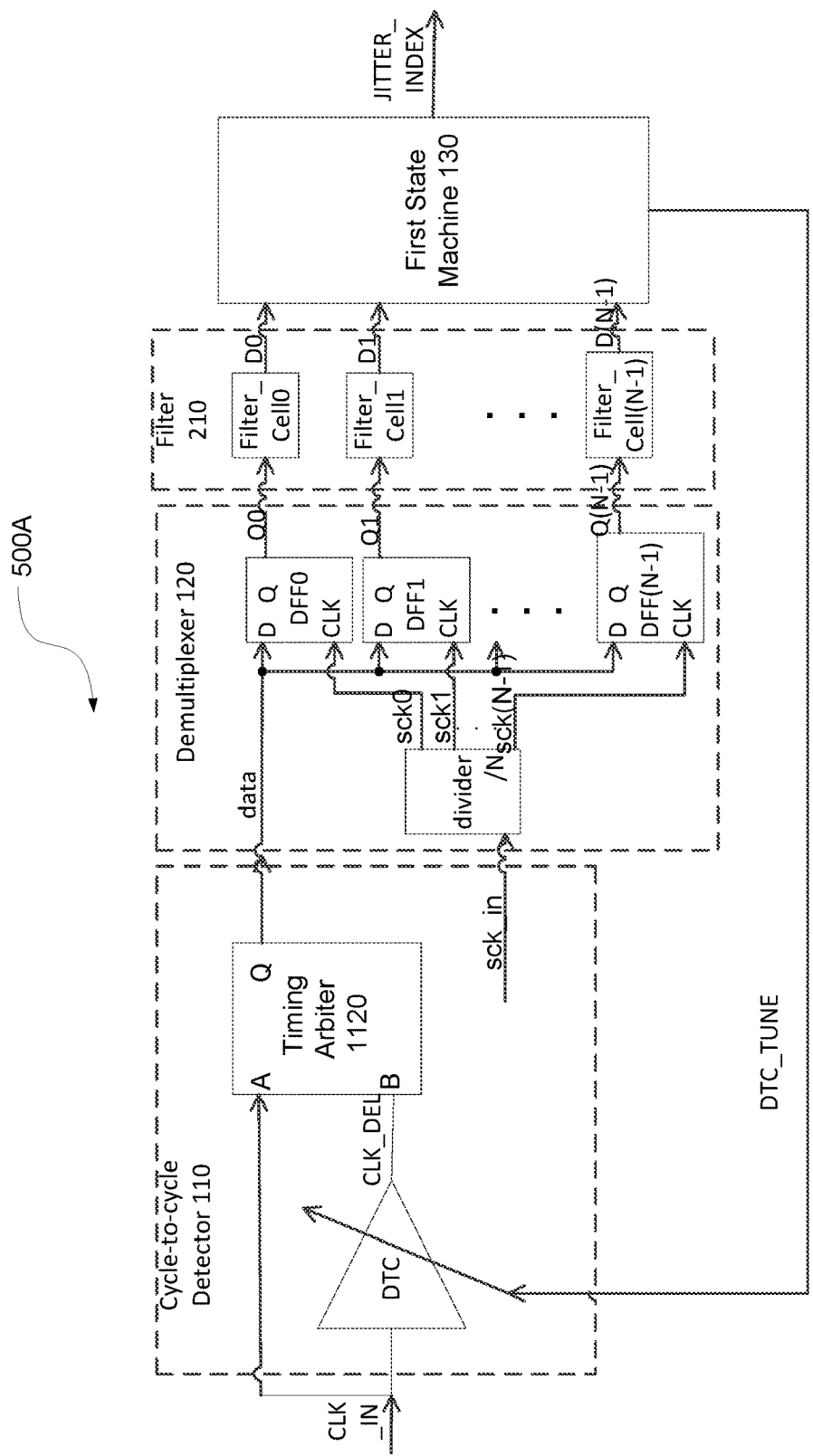
FIG. 5A is a diagram illustrating a circuit for jitter detection according to an embodiment of the invention.

FIG. 5A is a diagram illustrating a circuit 500A for jitter detection according to an embodiment of the invention. FIG. 5A is more detailed implementation of the circuit 200A shown in FIG. 2A. As shown in the circuit 500A of FIG. 5A, the cycle-to-cycle detector 110 can be implemented by the circuit 310B shown in FIG. 3B. The demultiplexer 120 can be implemented by the circuit shown in FIG. 4A.

Figure 5B:
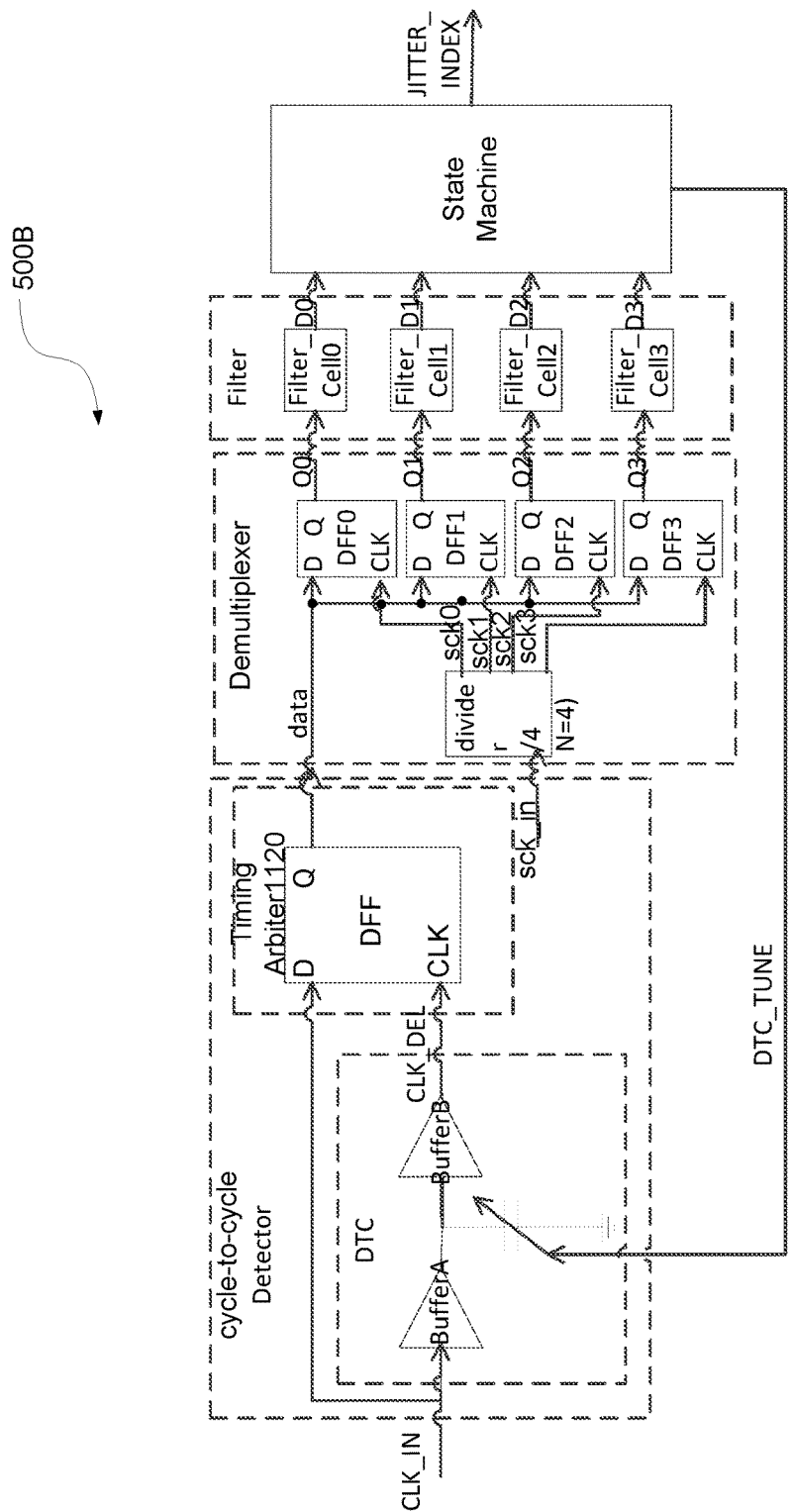
FIG. 5B is a diagram illustrating a circuit for jitter detection according to another embodiment of the invention.

FIG. 5B is a diagram illustrating a circuit 500B for jitter detection according to another embodiment of the invention. Compared with FIG. 5A, the circuit 500B instantiates the amount of DFFs to four. As shown in FIG. 5B, D0 is the output of Filter_Cell0, which represents an average value of data Q0 outputted by a first path of the demultiplexer over a period of time. D1 is the output of Filter_Cell1, which represents an average value of data Q1 outputted by a second path of the demultiplexer over a period of time. D2 is the output of Filter_Cell2, which represents an average value of data Q2 output by a third path of the demultiplexer over a period of time. D3 is the output of Filter_Cell3, which represents an average value of data Q3 outputted by a first path of the demultiplexer over a period of time. In another embodiment, the cycle-to-cycle detector 110 also can be implemented by the circuit 310B shown in FIG. 3B.

Figure 6:
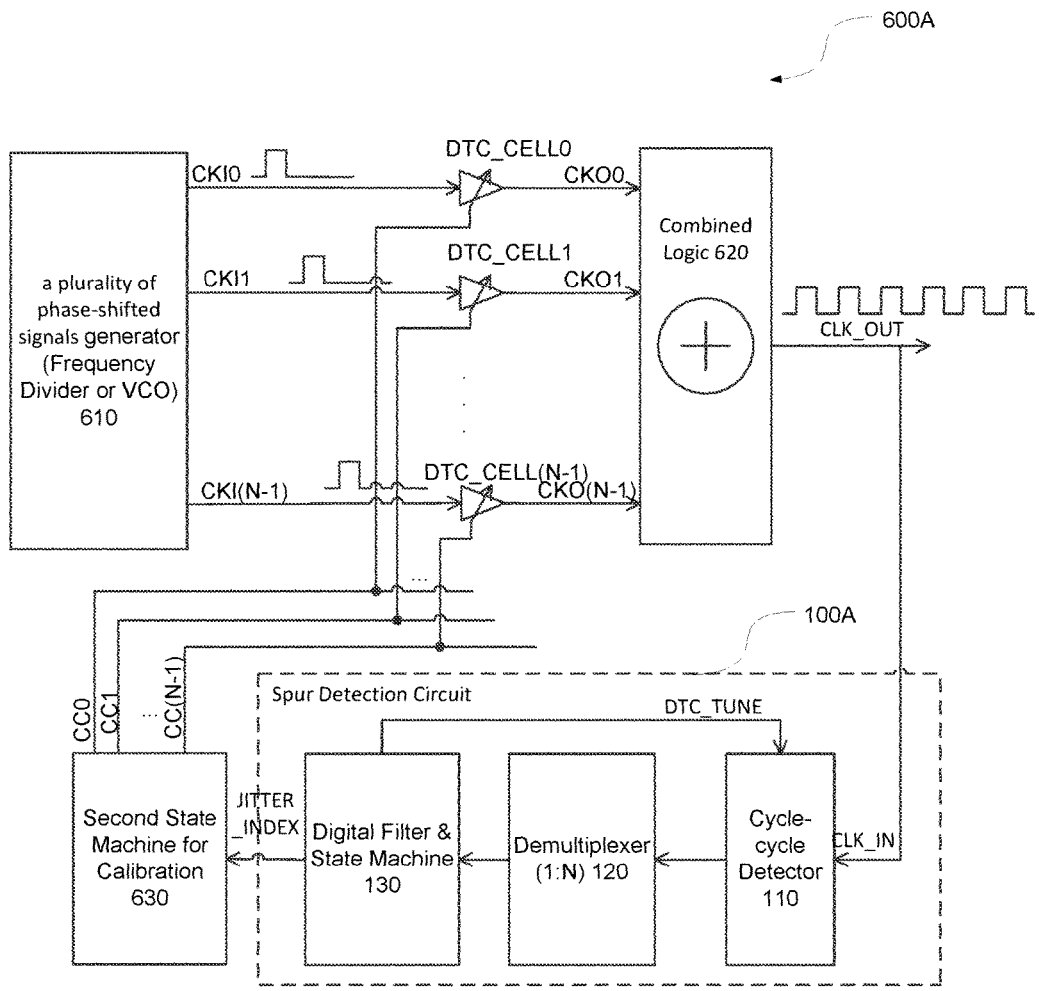
FIG. 6 is a diagram illustrating a plurality of phase-shifted synthesized signal generator and jitter eliminator according to another embodiment of the invention.

FIG. 6 is a diagram illustrating a plurality of phase-shifted synthesized signal generator and jitter eliminator according to another embodiment of the invention.

The circuit 600A comprises the circuit 100A for jitter detection. Since the circuit 100A is already discussed with respect to FIG. 1A, it is not discussed in further detail here. In addition to the circuit 100A, the circuit 600A further comprises a generator for a plurality of phase-shifted signals 610, a plurality of digital time converter cells DTC_CELL0, DTC_CELL1, . . . DTC_CELL(N−1), a combined logic 620, and a second state machine for calibration 630. The generator for the plurality of phase-shifted signals 610 is configured to generate a plurality of input clock component signals CKI0, CKI1, . . . CKI(N−1). The generator for the plurality of phase-shifted signals 610 may be a frequency divider or a voltage controlled oscillator (VCO). Each of the plurality of digital time converter cells DTC_CELL0, DTC_CELL1, . . . DTC_CELL(N−1) is connected to a corresponding output port of the generator for the plurality of phase-shifted signals 610, and is configured to receive a corresponding one of the plurality of input clock component signals CKI0, CKI1, . . . CKI(N−1), and delay the corresponding one of the plurality of input clock component signals CKI0, CKI1, . . . CKI(N−1) according to a control word CC0, CC1 . . . CC(N−1), and output a corresponding output clock component signal CKO0, CKO1, . . . CKO(N−1).

The combined logic 620 is connected to the plurality of digital time converter cells DTC_CELL0, DTC_CELL1, . . . DTC_CELL(N−1), and is configured to generate the synthesized clock signal CLK_OUT by adding a plurality of output clock component signals CKO0, CKO1, . . . CKO (N−1).

The first state machine 130 is configured to calculate a jitter index JITTER_INDEX according to the tuning signal DTC_TUNE. The JITTER_INDEX may be a single value, a vector, a group of values, etc.

The second state machine for calibration 630 is connected to the first state machine 130, and configured to adjust the control word CC0, CC1 . . . CC(N−1) of the plurality of digital time converter cells, so as to adjust the jitter index. For example, when each set of {CCi, i=0, 1, . . . , N−1} is scanned, jitter_index of all {CCi} can be obtained. The CCi with minimum jitter_index among all {CCi} is selected as the final result for control word CCi, so as to obtain final CC0, CC1 . . . CC(N−1). Taken N=2 as an example, each set of {CCi} is scanned, that is, all combinations of CC0 and CC1, and jitter_index of all combinations of CC0 and CC1 can be obtained. The CC0 and CC1 corresponding to minimum jitter_index of all {CCi} is selected as the final CC0 and CC1, that is the CC0 in the selected combination is the final CC0, and the CC1 in the selected combination is the final CC1. The adjustment is completed when an adjusted jitter index signal JITTER_INDEX equals to or is smaller than a predetermined jitter threshold, or when the jitter index signal JITTER_INDEX gets its minimum value for a specific adjustment period.

Figure 7:
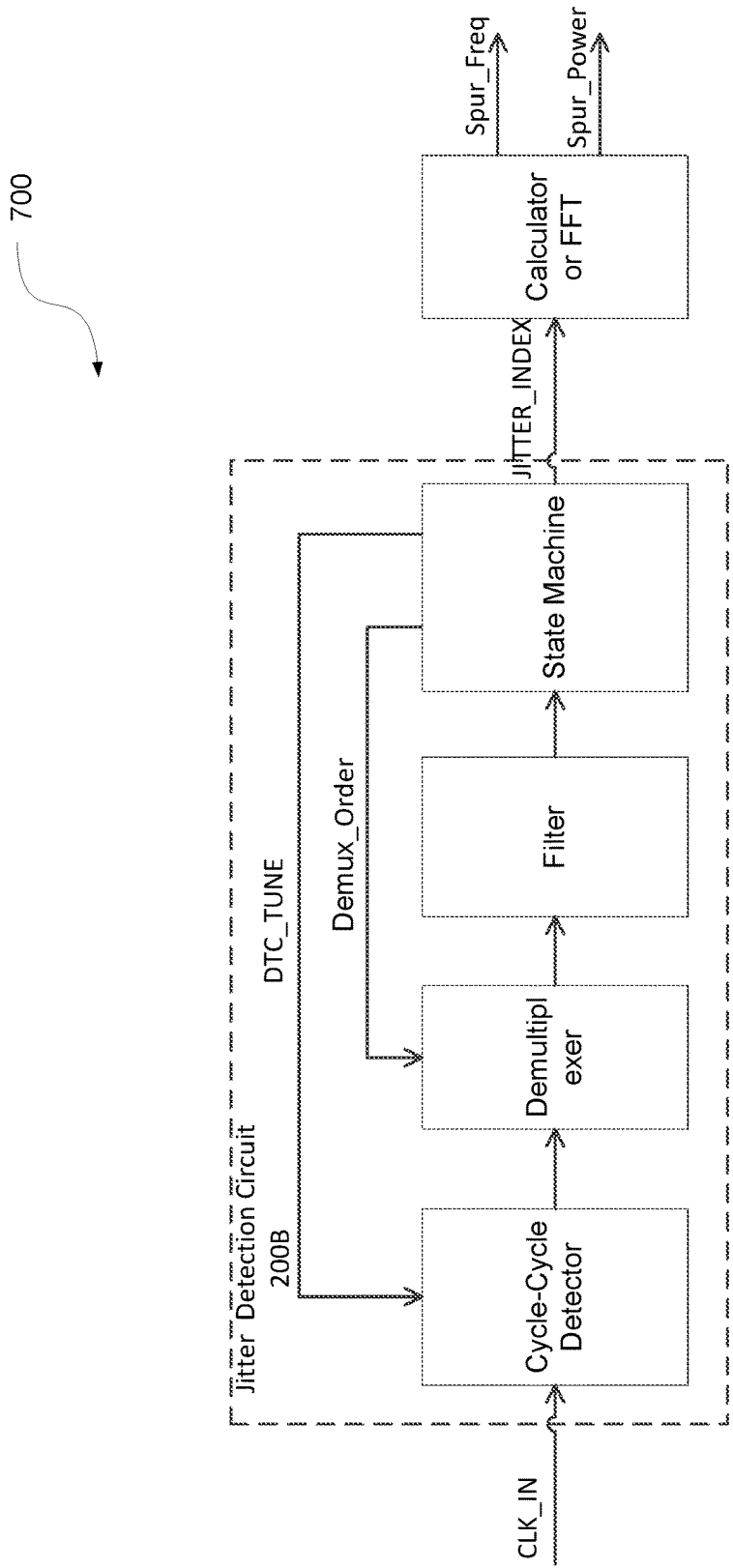
FIG. 7 is a diagram illustrating a jitter detection analyzing system according to an embodiment of the invention.

FIG. 7 is a diagram illustrating a jitter detection analyzing system 700 according to an embodiment of the invention. In addition to the jitter detection circuit 200B already discussed with respect to FIG. 2B, the jitter detection analyzing system 700 further comprises a calculator or a Fast Fourier Transform (FFT) circuit configured to generate signals indicating Spur frequency and spur power, or jitter index signal according to the JITTER_INDEX.

Figure 8:
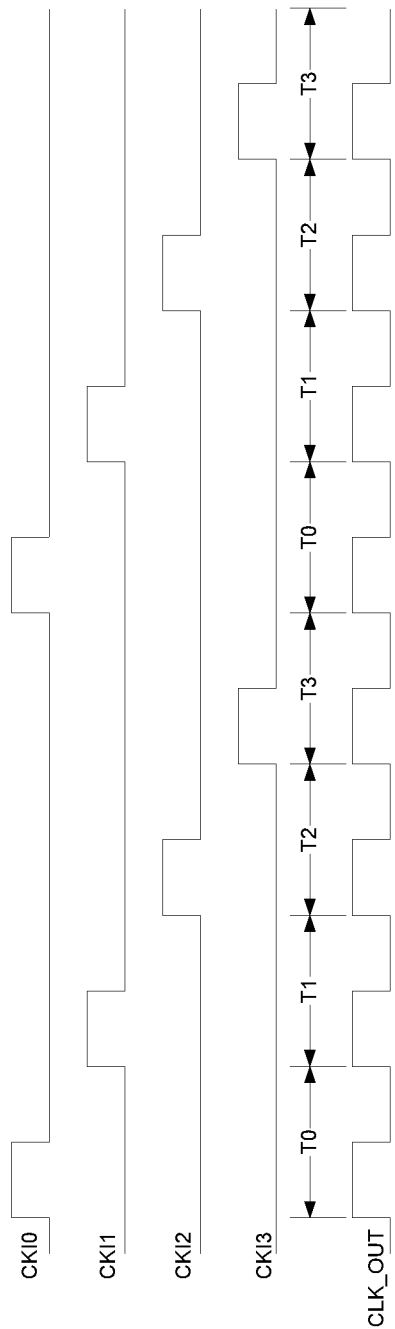
FIG. 8 is a diagram illustrating a timing sequence for synthesized clock signal output according to another embodiment of the invention.

FIG. 8 is a diagram illustrating a timing for synthesized clock signal output according to another embodiment of the invention. FIG. 8 shows that the synthesized clock signal CLK_OUT is the sum of the plurality of input clock component signals CKI0, CKI1, CKI2 and CKI3. When the input clock component signals CKI0, CKI1, CKI2 and CKI3 match with each other, the cycle duration T0, T1, T2 and T3 are the same. However, when there are mismatches among the input clock component signals CKI0, CKI1, CKI2 and CKI3, the time difference between any two neighboring cycles may vary.

Referring back to FIGS. 6 and 7, as the synthesized clock signal CLK_OUT is combined by a plurality of input clock component signals CKI0, CKI1, . . . CKI(N−1), and due to the mismatch in physical wirings, or mismatch in the input phase paths, the output clock component signal CKO0, CKO1, . . . CKO (N−1) may have phase offsets, thus the synthesized clock signal CLK_OUT generated by adding a plurality of output clock component signals CKO0, CKO1, . . . CKO (N−1) may have a spur shown in FIG. 9A.

Figure 9A:
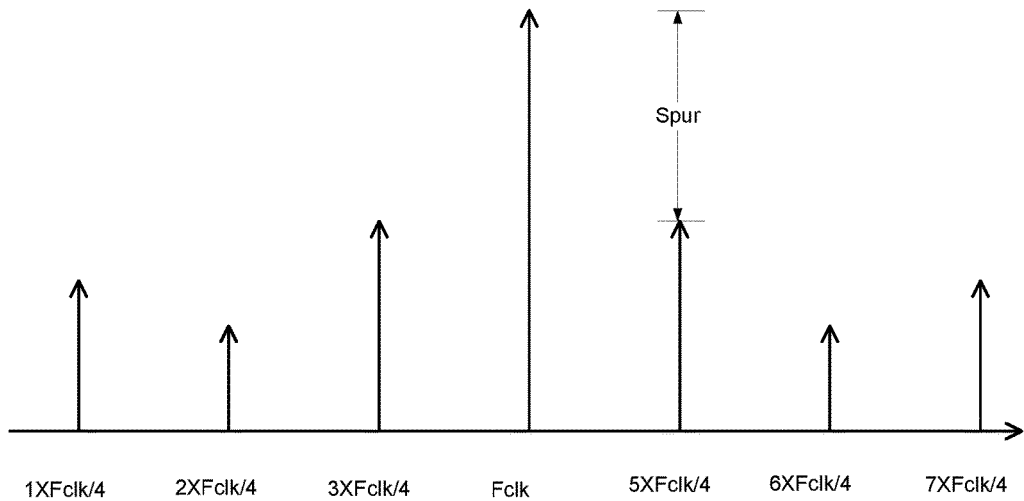
FIGS. 9A and 9B are diagrams respectively illustrating a spur caused by mismatch and that the spur is eliminated with the use of embodiments of the invention.
Figure 9B:
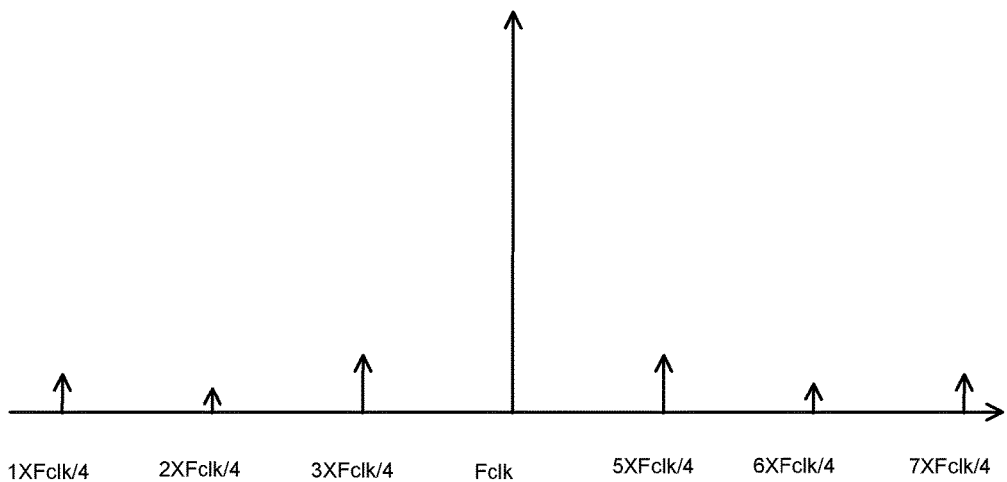

FIGS. 9A and 9B are diagrams respectively illustrating a spur caused by mismatch and that the spur is eliminated with the use of embodiments of the invention.

In FIGS. 9A and 9B, the X axis represents frequency, and the Y axis represents amplitude. As shown in FIG. 9A, the amplitude at the frequency Fclk is the signal that is needed, and the signals at other frequency components (such as 3*Fclk/4, 5*Fclk/4 etc.) are interferences that should be avoided. Spurs are shown at the frequency 1*Fclk/4, 2*Fclk/4, 3*Fclk/4, 5*Fclk/4, 6*Fclk/4 and 7*Fclk/4, if there are mismatch among input clock components. FIG. 9B shows that the spur shown in FIG. 9A is eliminated by using an embodiment of the invention.

Figure 10:
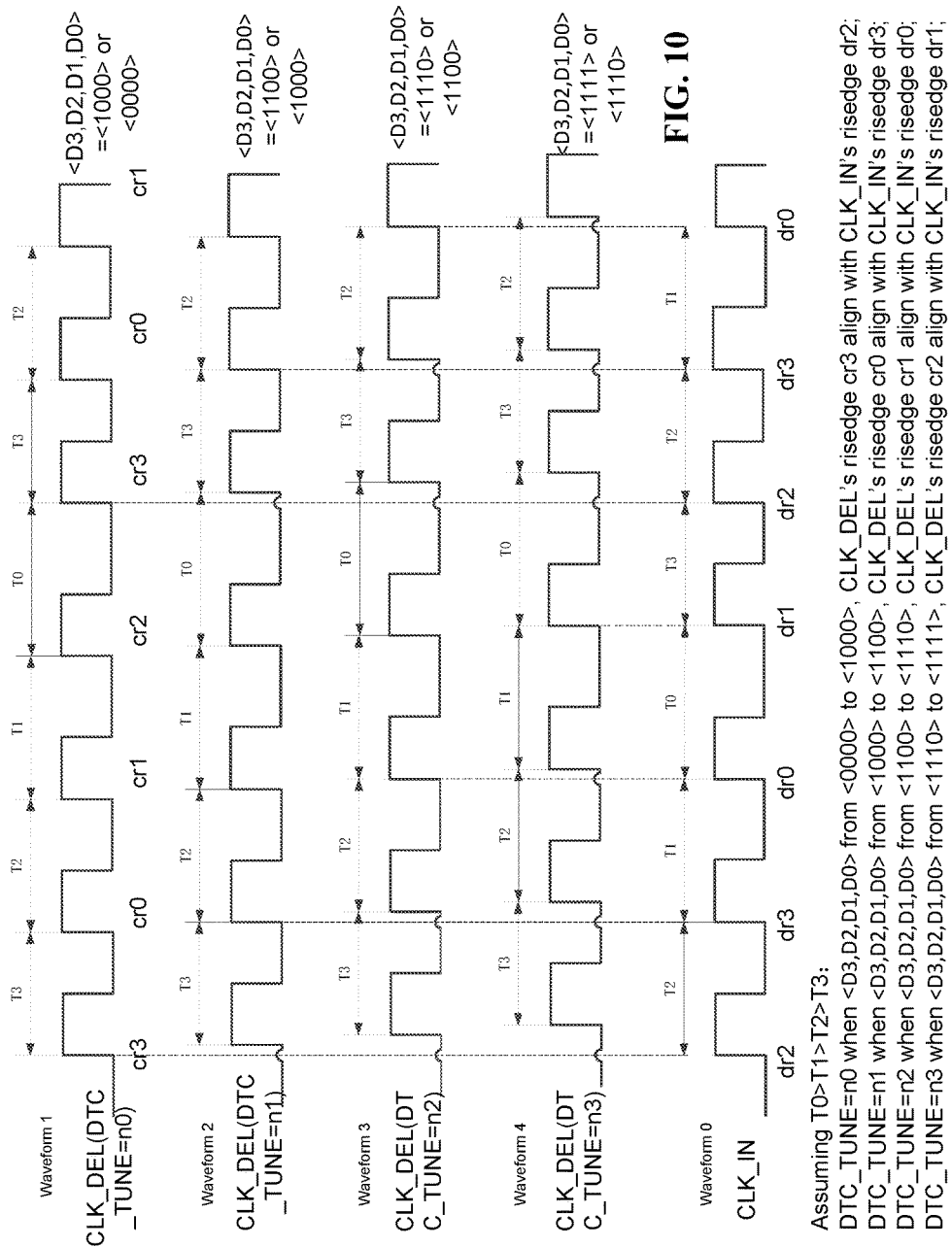
FIG. 10 is a timing sequence diagram for jitter detection according to another embodiment of the invention.

FIG. 10 is a timing sequence diagram for jitter detection according to another embodiment of the invention. D0, D1, D2 and D3 shown in FIG. 10 are the same as the D0, D1, D2 and D3 shown in FIG. 5B.

Assuming T0>T1>T2>T3:

Referring to FIG. 10, the CLK_IN signal in FIG. 10 is same as the CLK_IN shown in FIGS. 5A and 5B. D0 in FIG. 10 represents the signal D0 output by the Filter_Cell 0 shown in FIG. 5B. D1 in FIG. 10 represents the signal D1 output by the Filter_Cell 1 shown in FIG. 5B. D2 in FIG. 10 represents the signal D2 output by the Filter_Cell 2 shown in FIG. 5B. D3 in in FIG. 10 represents the signal D3 output by the Filter_Cell 3 shown in FIG. 5B. Further, the CLK_IN in FIG. 10 is the same as CLK_OUT in FIG. 8. Further, as shown in FIG. 6, the output signal CLK_OUT of the combined logic 620 is the same signal CLK_IN that is fed to the cycle-to-cycle detector 110. As shown in FIG. 10, signal CLK_DEL falls behind CLK_IN for approximate one cycle. For example, the waveforms shown in FIG. 10 are respectively represented as waveform 1, waveform 2, waveform 3, waveform 4, and waveform 0 from the upper to the bottom. The cycle T2 of waveform 1 (corresponding to CLK_DEL when DTC_TUNE=n0) falls behind T2 of waveform 0 (CLK_IN) for almost a cycle.

Then, DTC delay time is moved (for example, by increasing DTC control word DTC_TUNE) step by step, therefore rising edge cr3 of CLK_DEL gradually moves towards rising edge dr2 of CLK_IN. When timing arbiter 1120 determines that rising edge cr3 of CLK_DEL aligns with rising edge dr2 of CLK_IN, the timing arbiter 1120 records the DTC_TUNE value at that time, which is denoted by n0, as indicated by the leftmost dotted vertical line.

Again, DTC delay time is moved (for example, by increasing DTC control word DTC_TUNE) step by step, therefore rising edge cr0 of CLK_DEL gradually moves towards rising edge dr3 of CLK_IN. When timing arbiter 1120 determines that rising edge cr0 of CLK_DEL aligns with rising edge dr3 of CLK_IN, the timing arbiter 1120 records the DTC_TUNE value at that time, which is denoted by n1, as indicated by the second left dotted vertical line.

Therefore, the difference between successive periods T2 and T3 is equal to (n1−n0)*$K_{DTC}$.

Finally, continue to increase the DTC control word DTC_TUNE, and the difference between the rest of the period can also be determined.

In other words, the timing arbiter combines a plurality of judgments, and determines the size of the cycle, as shown in FIG. 10, Waveform 1 (CLK_DEC (DTC_TUNE=n0)) samples waveform 0 (CLK_IN), time point cr3 samples the output waveform 0 to get the result of D3; and time point cr0 samples the output waveform 0 to get the result D2;

Gradually moving DTC_TUNE, in a previous moment, before cr3 samples the rising edge dr2 of the waveform 0, ie, D3=0, then (DTC_TUNE+1) after cr3 samples the rising edge dr2 of the waveform 0, D3=1; that is, when D3 transits from 0 to 1, cr3 of waveform 1 aligns with dr2 of waveform 0, or the starting point of cycle T2 aligns with that of the cycle T3.

At the same time when cr3 of waveform 1 aligns with dr2 of waveform 0 (or the starting point of cycle T2 aligns with that of the cycle T3), cr0 of waveform 1 samples waveform 0, and the result is D2, when D2=0, it means that cr0 is prior to the dr3 of waveform 0, therefore T3 is smaller than T2.

Similarly, based on changes of four values of D3, D2, D1, D0 with the gradual increase of DTC_TUNE, the relative relationship of sizes among the four cycles T1, T2, T3 and T4 can determined.

DTC_TUNE=n0, when <D3,D2,D1,D0> changes from <0000> to <1000>. It means that CLK_DEL's rising edge cr3 aligns with CLK_IN's rising edge dr2, which is illustrated by the leftmost dotted line;

DTC_TUNE=n1, when <D3,D2,D1,D0> changes from <1000> to <1100>. It means that CLK_DEL's rising edge cr0 aligns with CLK_IN's rising edge dr3, which is illustrated by the dotted line counted second from the left;

DTC_TUNE=n2, when <D3,D2,D1,D0> changes from <1100> to <1110>. It means that CLK_DEL's rising edge cr1 aligns with CLK_IN's rising edge dr0, which is illustrated by the dotted line counted third from the left;

DTC_TUNE=n3, when <D3,D2,D1,D0> changes from <1110> to <1111>. It means that CLK_DEL's rising edge cr2 aligns with CLK_IN's rising edge dr1, which is illustrated by the dotted line counted fourth from the left.

The following equations can be generated based the jitter detection above, wherein $K_{DTC}$ is a constant coefficient, which represents the gain of DTC. Referring to either FIG. 3A or FIG. 3B, an input of a digital time converter is a control word DTC_TUNE. An output of the digital time converter equals DTC_TUNE×$K_{DTc}$.

$$\begin{cases} T_2 - T_3 = (n_1 - n_0) \cdot K_{DTC} \\ T_1 - T_2 = (n_2 - n_1) \cdot K_{DTC} \\ T_0 - T_1 = (n_3 - n_2) \cdot K_{DTC} \end{cases} \quad \text{eq.(1)}$$

Considering that the timing's average periods T is a constant, there is $$T_1+T_2+T_3+T_4=4T \quad \text{eq.(2)}$$

Further, parameters are defined as following $$\begin{cases} \Delta n_1 = n_1 - n_0 \\ \Delta n_2 = n_2 - n_1 \\ \Delta n_3 = n_3 - n_2 \end{cases} \quad \text{eq.(3)}$$

With some detail derivation steps, the following equations are obtained:

$$\begin{cases} T_0 - \overline{T} = \dfrac{1}{4}(\Delta n_1 + \Delta n_2 + 2\Delta n_3) \cdot K_{DTC} \\ T_1 - \overline{T} = \dfrac{1}{4}(\Delta n_1 + \Delta n_2 - 2\Delta n_3) \cdot K_{DTC} \\ T_2 - \overline{T} = \dfrac{1}{4}(\Delta n_1 - 3\Delta n_2 - 2\Delta n_3) \cdot K_{DTC} \\ T_3 - \overline{T} = \dfrac{1}{4}(-3\Delta n_1 - 3\Delta n_2 - 2\Delta n_3) \cdot K_{DTC} \end{cases} \quad \text{eq.(4)}$$

The parameters are defined as $$\{J_c\} = \dfrac{1}{\overline{T}}\begin{bmatrix} T_0 - \overline{T} \\ T_1 - \overline{T} \\ T_2 - \overline{T} \\ T_3 - \overline{T} \end{bmatrix}; \quad \text{eq.(5.1)}$$

$$\{\Delta n_i\} = \begin{bmatrix} \Delta n_1 \\ \Delta n_2 \\ \Delta n_3 \end{bmatrix}; \quad \text{eq.(5.2)}$$

$$\{A\} = \begin{bmatrix} 1 & 1 & 2 \\ 1 & 1 & -2 \\ 1 & -3 & -2 \\ -3 & -3 & -2 \end{bmatrix}; \quad \text{eq.(5.3)}$$

Therefore $$\{J_c\} = \dfrac{K_{DTC}}{4 \cdot \overline{T}} \cdot \{A\} \cdot \{\Delta n_i\} \quad \text{eq.(6)}$$

$$\text{Jitter\_index} = \text{var}(\{J_c\}) = \left( \dfrac{1}{4} \sum_{i=0}^{3} \left( \dfrac{T_i - \overline{T}}{\overline{T}} \right)^2 \right) \quad \text{eq.(7)}$$

In equation 7, "var" means variance. Alternatively, the equation 7 may use other functions instead of the variance, such as the addition of absolute values, For example, Jitter_index=$\Sigma|J_c|$.

Figure 11:
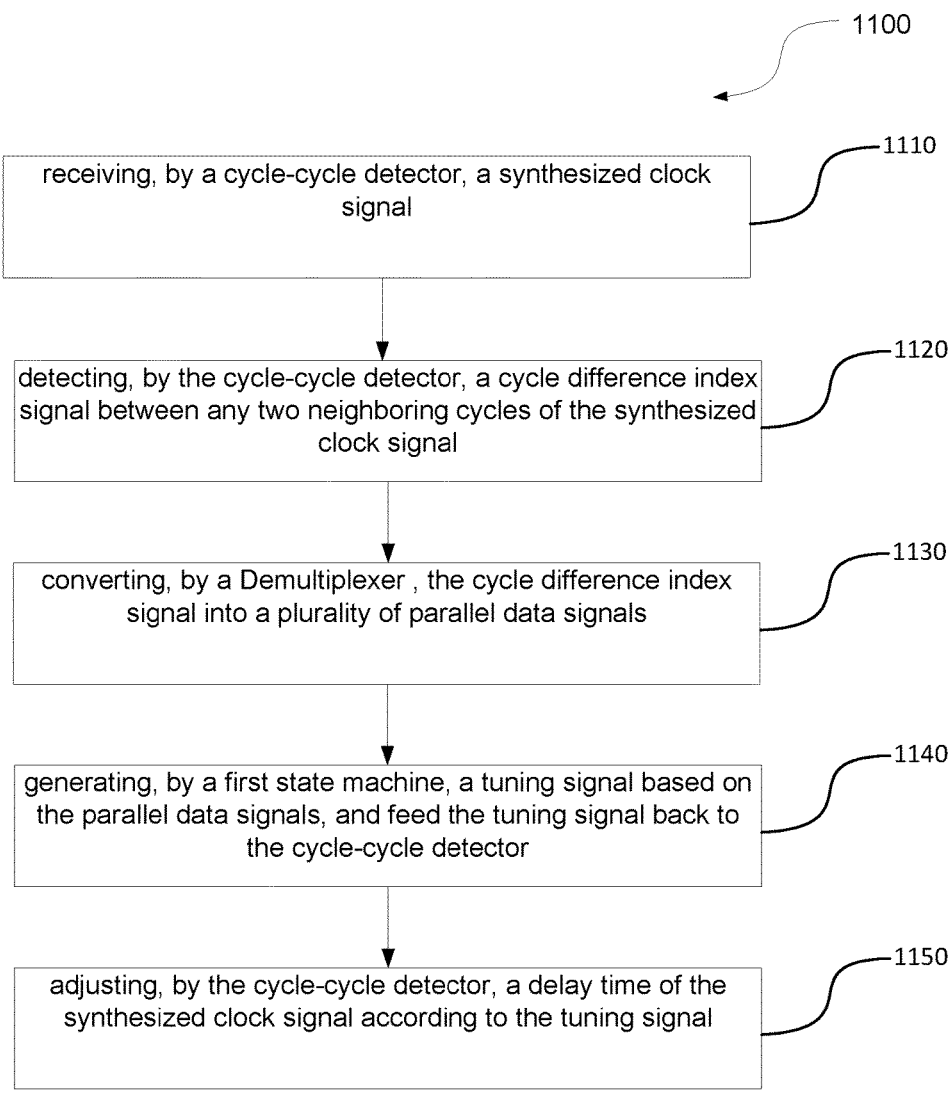
FIG. 11 is a flow chart illustrating a method of adjusting jitter according to an embodiment of the invention.

FIG. 11 is a flow chart illustrating a method of adjusting jitter according to an embodiment of the invention. The method 1100 comprises receiving, by a cycle-cycle detector in block 1110, a synthesized clock signal; detecting, by the cycle-cycle detector in block 1120, a cycle difference index signal between any two neighboring cycles of the synthesized clock signal, wherein the synthesized clock signal is combined by a plurality of phase-shifted signals; converting, by a Demultiplexer, in block 1130, the cycle difference index signal into a plurality of parallel data signals; generating, by a first state machine in block 1140, a tuning signal based on the parallel data signals, and feed the tuning signal back to the cycle-cycle detector; and adjusting, by the cycle-cycle detector in block 1150, a delay time of the synthesized clock signal according to the tuning signal.

Alternatively, the method 1100 further comprises (not shown in FIG. 11) generating, by a filter, filtered parallel data signals by filtering the plurality of parallel data signals; and wherein the generating further generating the tuning signal based on the filtered parallel data signals, and feeding the tuning signal back to the cycle-cycle detector.

Alternatively, the method 1100 further comprises (not shown in FIG. 11) generating, by the first state machine, an order signal based on the parallel data signals; and regulating, by the Demultiplexer, the plurality of parallel data signals' sequence according to the order signal.

Alternatively, the detecting in block 1120 further comprises generating, by a digital time converter, a delayed clock signal by regulating the synthesized clock signal with the tuning signal; and receiving, by a timing arbiter, the synthesized clock signal and the delayed clock signal, and generating, by the timing arbiter, the cycle difference index signal, wherein the cycle difference index signal indicates an order between the synthesized clock signal and the delayed clock signal.

Alternatively, the digital time converter comprises a first buffer, a second buffer and a variable capacitor, wherein generating, by a digital time converter in block 1140, a delayed clock signal by regulating the synthesized clock signal with the tuning signal further comprises outputting the delayed clock signal by filtering, by a variable capacitor using the tuning signal, a buffered signal outputted by a first buffer.

Alternatively, the timing arbiter further comprises a first D-type flip flop (DFF), wherein a clk port of the first DFF is configured to receive the synthesized clock signal, a D port of the first DFF is configured to receive the delayed clock signal, and a Q port of the first DFF is configured to output the cycle difference index signal.

Alternatively, the timing arbiter further comprises a first D-type flip flop (DFF), wherein a clk port of the first DFF is configured to receive the delayed clock signal, a D port of the first DFF is configured to receive the synthesized clock signal, and a Q port of the first DFF is configured to output the cycle difference index signal.

Alternatively, the Demultiplexer comprises a divider and a plurality of second DFFs, wherein the cycle difference index signal comprises a plurality of bits; the method further comprises (not shown in FIG. 11) dividing, by the divider, a received synthesizer clock signal into a plurality of synthesizer clock components, outputting, each of the plurality of synthesizer clock components into a clock port of a corresponding second DFFs; receiving, by a D port of each of the plurality of second DFFs, a corresponding bit of the cycle difference index signal; outputting, by a Q port of each of the plurality of second DFFs, a corresponding bit of the parallel data signals.

Alternatively, the method 1100 further comprises (not shown in FIG. 11) generating, by a generator for a plurality of phase-shifted signals, a plurality of clock component signals; receiving, by each of the plurality of digital time converter cells connected to a corresponding output port of the generator for the plurality of phase-shifted signals, a corresponding one of the plurality of clock component signals; delaying, by each of the plurality of digital time converter cells, the corresponding one of the plurality of clock component signals according to a control word, outputting, by each of the plurality of digital time converter cells, a corresponding output clock component signal, generating, by a combined logic connected to the plurality of digital time converter cells, the synthesized clock signal by adding a plurality of output clock component signals; calculating, by the first state machine, a jitter index according to the tuning signal; adjusting, by a second state machine connected to the first state machine, a control word of each of the plurality of digital time converter cells, so as to adjust the jitter index; wherein the adjustment is completed when an adjusted jitter index equals to or is smaller than a predetermined jitter threshold, or when the jitter index gets its minimum value for a specific adjustment period.

Figure 12:
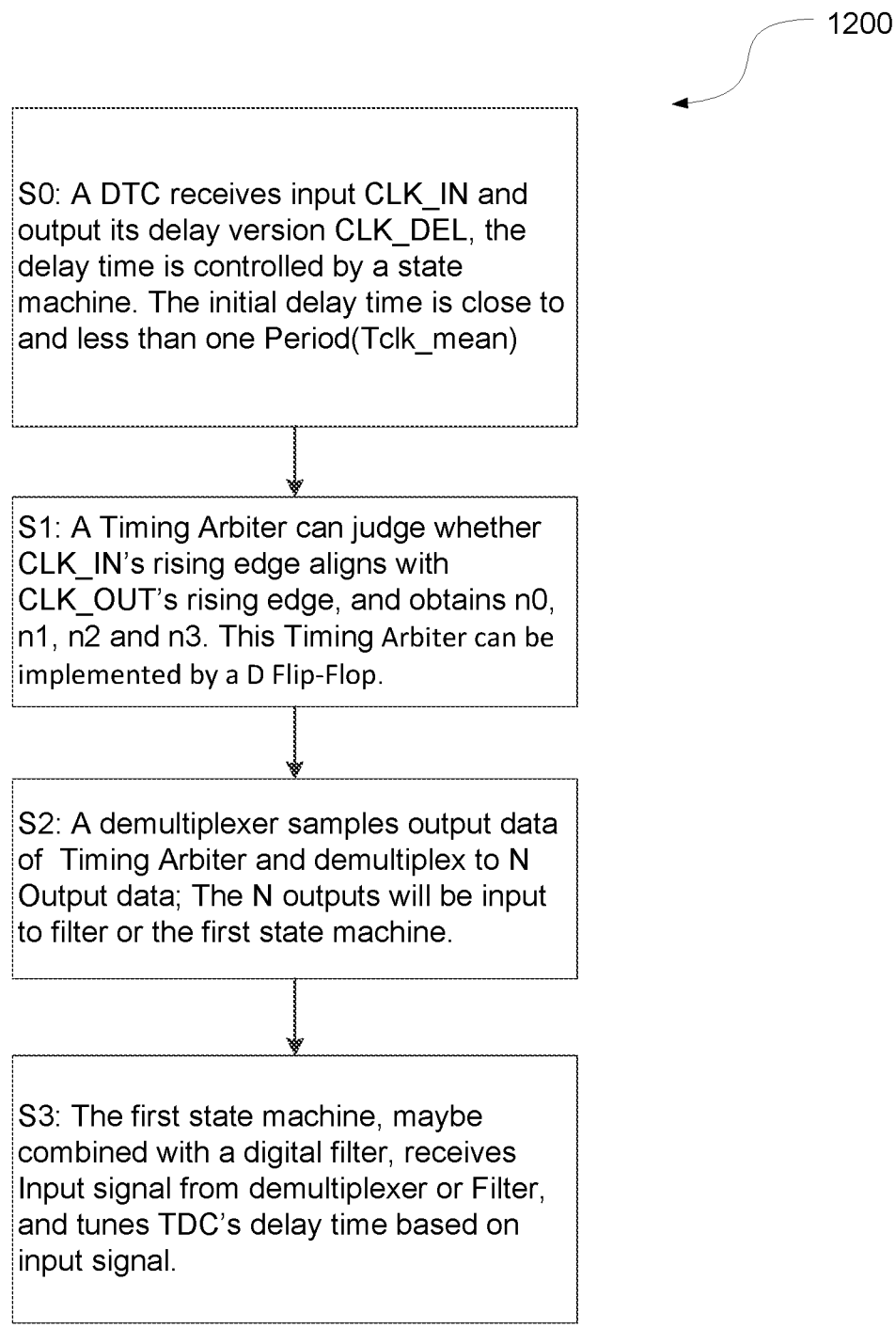
FIG. 12 is a flow chart illustrating a method for eliminating jitter according to an embodiment of the invention.

FIG. 12 is a flow chart illustrating a method 1200 for eliminating jitter according to an embodiment of the invention. The method 1200 comprises, receiving, by a DTC in block S0, input CLK_IN, and outputting its delay version CLK_DEL, the delay time is controlled by a second state machine. The initial delay time is close to and less than one Period(Tclk_mean=T) to ensure that the timing arbiter will not make erroneous judgement; judging by a timing arbiter in block S1, whether CLK_IN's rising edge aligns with CLK_DEL's rising edge, and obtaining n0, n1, n2 and n3 respectively. Note the timing arbiter can be implemented by a D Flip-Flop. The method 1200 further comprises sampling, by a demultiplexer in block S2, output data of the timing arbiter and demultiplexing to N Output data. The N output data will be input to filters or the first state machine. The method 1200 further comprises receiving by the first state machine optionally combined with a digital filter in block S3, input signals from the demultiplexer or filter, and tuning DTC's delay time based on the input signal.

Figure 13:
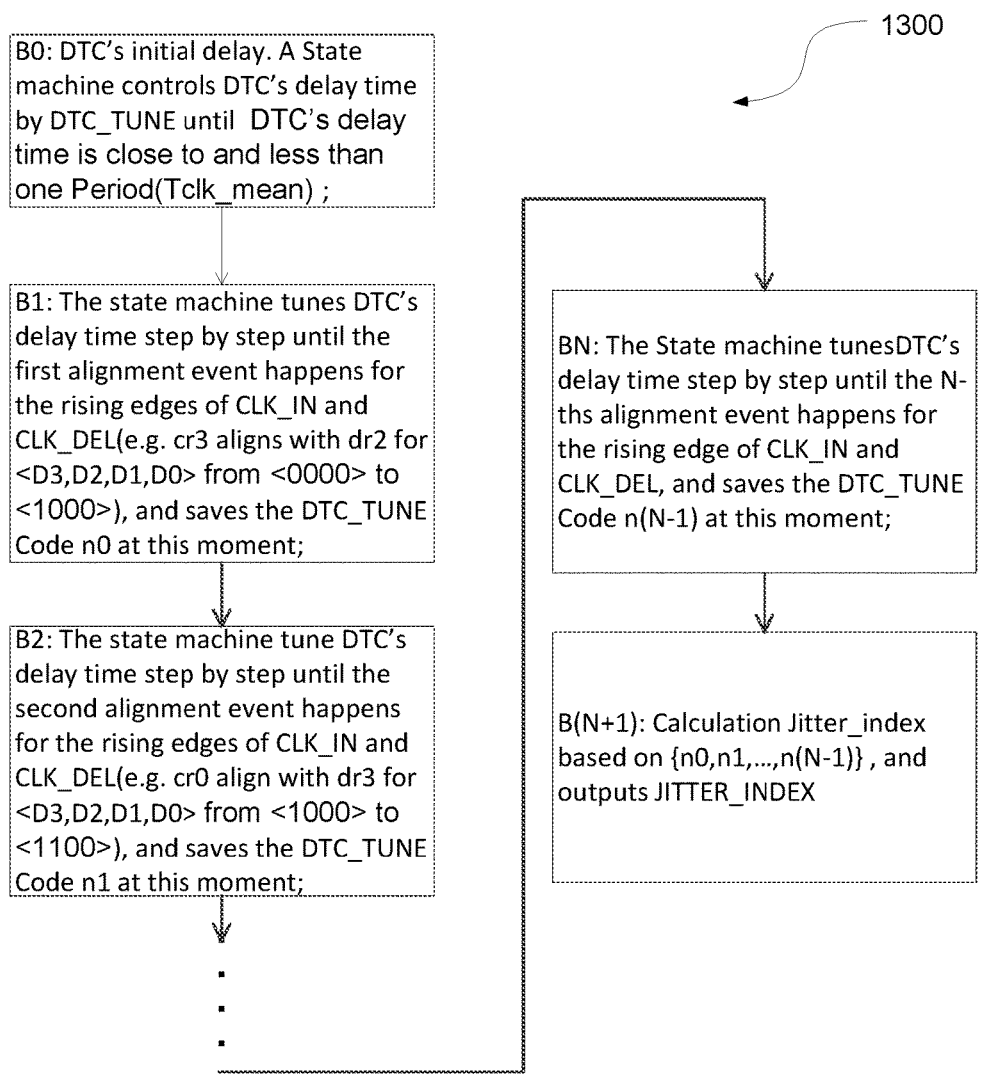
FIG. 13 is a flow chart illustrating a method of calculating jitter index signal according to another embodiment of the invention.

FIG. 13 is a flow chart illustrating a method of calculating jitter index according to another more detailed embodiment of the invention.

The method 1300 comprises controlling or adjusting DTC's delay time by a second state machine using DTC_TUNE in block B0 until DTC's delay time is close to and less than one Period (Tclk_mean or T̄), and the DTC's initial delay is set. The method 1300 further comprises tuning, in block B1 by the state machine, DTC's delay time step by step until the first alignment event happens for the rising edge of CLK_IN and CLK_DEL (e.g. rising edge cr3 aligns with rising edge dr2 for <D3,D2,D1,D0> from <0000> to <1000> as discussed above in FIG. 10), and saving the DTC_TUNE Code n0 at this moment; tuning, in block B2 by the state machine, DTC's delay time step by step until the second alignment event happens for the rising edge of CLK_IN and CLK_DEL (e.g. rising edge cr0 aligns with rising edge dr3 for <D3,D2,D1,D0> from <1000> to <1100> as discussed above in FIG. 10), and saving the DTC_TUNE Code n1 at this moment. The method 1300 comprises tuning the delay time step by step, then in block BN, the method 1300 comprises tuning, by the State machine, DTC's delay time step by step until the N-ths alignment event happens for the rise edge of CLK_IN and CLK_DEL, and saving the DTC_TUNE Code n(N−1) at this moment. Then, in block B(N+1), the method comprises calculating JITTER_INDEX based on {n0, n1, . . . , n(N−1)}, and outputting JITTER_INDEX, as discussed above according to equations 1-7 for example.

Figure 14:
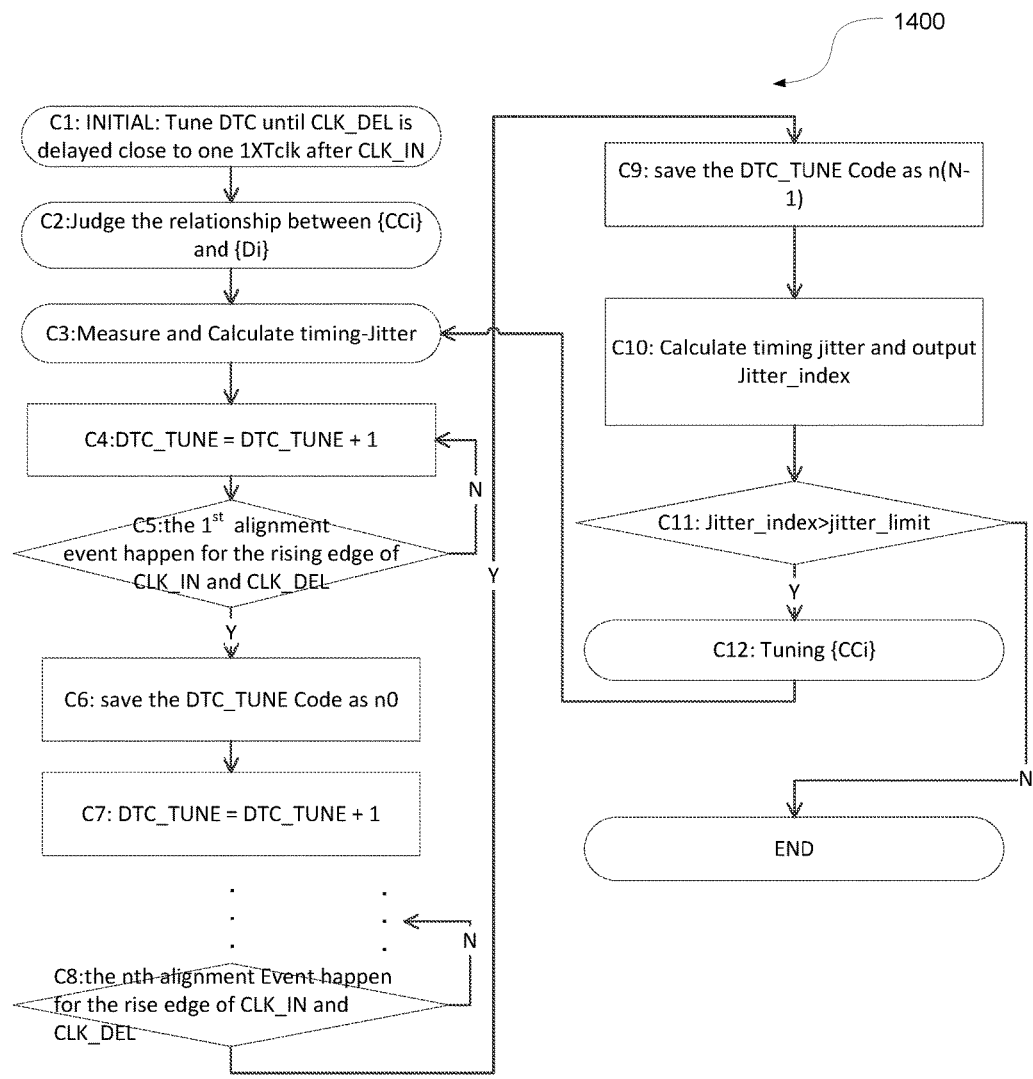
FIG. 14 a flow chart illustrating a method for eliminating jitter according to another embodiment of the invention.

FIG. 14 is a flow chart illustrating a method for eliminating jitter according to another embodiment of the invention. The method 1400 comprises, in block C1, tuning DTC until CLK_DEL is delayed close to one 1*Tclk after CLK_IN, determining, in block C2, the relationship between the control word {CCi} (see FIG. 6) and {Di} output by filter 210 (see FIG. 5A), that is, the correspondence between CCi and Di, wherein i=0, 1, . . . , N−1. For example, the method 1400 determines that CC1 may correspond to D1, thus CC1 correspond to T1, CC2 may correspond to D3, thus CC2 correspond to T3, CC3 may correspond to D2, thus CC3 correspond to T2, CC0 may correspond to D0, thus CC4 correspond to T0.

The method 1400 then measures and calculates, in block C3, timing-Jitter JITTER_INDEX as discussed above with respect to equations (1)-(7). The method 1400 then proceeds with a next DTC_TUNE in block C4, the next DTC_TUNE=DTC_TUNE+1. Then in block C5, the method 1400 further check if the first alignment event happens for the rising edges of CLK_IN and CLK_DEL in block C5. If the first alignment event happens, the method 1400 proceeds with block C6 to save the DTC_TUNE Code as n0. If the first alignment event does not happen, the method 1400 proceeds with block C4. Following block C6, in block C7, the method 1400 proceeds with a next DTC_TUNE. Then in block C8, the method 1400 determines if the nth alignment event happen for the rising edge of CLK_IN and CLK_DEL. If yes, the method 1400 proceeds with block C9, wherein the method 1400 saves the DTC_TUNE Code as n(N−1). Then the method 1400 proceeds with block C10, wherein the method 1400 calculates timing jitter and output JITTER_INDEX. In one embodiment, in block C11, the method 1400 determines whether the JITTER_INDEX>jitter_limit, if yes, the method 1400 proceeds with block C12, wherein the method 1400 continues to tune {CCi}; if not, the method 1400 ends.

Embodiment of the invention may be directed to spurious clock signal detection, jitter measurements, or eliminating spurious signal, and they can be applied to any one of fractional dividers, multipliers, clock synthesizers, spectral analysis circuits or systems.

Further, embodiments of the invention may directed to combined plurality of phase shifted clock signals, and proposes a method and device to detect spur or jitter, control digital-time-converter on the plurality of phase shifted clock signals based on the detection result by using a digital state machine or a filter, and reduce or eliminate the associated mismatch, so as to minimize the spur or jitter in the combined plurality of phase shifted clock signals. The spurious detection methods and implementation techniques of the invention do not require additional reference clocks and have a good performance. The system according to embodiments of the invention may detect clock jitter of less than one picosecond (sub-pS), while consuming less hardware resources.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present invention. Moreover, features of one embodiment may be incorporated into other embodiments, even where those features are not described together in a single embodiment within the present document. Accordingly, the invention is described by the appended claims.

I claim:
1. A circuit comprising:
 a cycle-cycle detector, comprising
 a digital-time converter configured to receive a synthesized clock signal and generate a delayed clock signal according to a tuning signal;
 a first D-type flip flop (DFF) connected to the digital-time converter, and configured to detect a cycle difference index signal between any two neighboring cycles of the synthesized clock signal according to the delayed clock signal, wherein the synthesized clock signal is combined by a plurality of phase shifted signals, and the cycle difference index signal indicates difference between two neighboring cycles for the synthesized clock signal;

a demultiplexer connected to the cycle-cycle detector, configured to convert the cycle difference index signal into a plurality of parallel data signals;

a first state machine, connected to both the demultiplexer and the cycle-cycle detector, configured to generate a tuning signal based on the parallel data signals, and feed the tuning signal back to the cycle-cycle detector, wherein the cycle-cycle detector is further configured to adjust delay time of the synthesized clock signal according to the tuning signal; and a filter connected between the Demultiplexer and the first state machine, configured to filter the plurality of parallel data signals, wherein the first state machine is further configured to generate the tuning signal based on the filtered parallel data signals, and feed the tuning signal back to the cycle-cycle detector.

2. The circuit according to claim 1, wherein the first state machine is further configured to generate an order signal based on the parallel data signals; and the Demultiplexer is further configured to regulate the plurality of parallel data signals' sequence according to the order signal.

3. The circuit according to claim 1, wherein the digital time converter comprises a first buffer, a second buffer and a variable capacitor, wherein the first buffer is connected to both the second buffer and the variable capacitor, and configured to receive the synthesized clock signal;

the second buffer is configured to output the delayed clock signal by filtering, by the variable capacitor using the tuning signal, a buffered signal outputted by the first buffer.

4. The circuit according to claim 1, wherein a clk port of the first DFF is configured to receive the synthesized clock signal, a D port of the first DFF is configured to receive the delayed clock signal, and a Q port of the first DFF is configured to output the cycle difference index signal.

5. The circuit according to claim 1, wherein a clk port of the first DFF is configured to receive the delayed clock signal, a D port of the first DFF is configured to receive the synthesized clock signal, and a Q port of the first DFF is configured to output the cycle difference index signal.

6. The circuit according to claim 1, wherein the Demultiplexer comprises a divider and a plurality of second DFFs, wherein the cycle difference index signal comprises a plurality of bits;

the divider is configured to divide a received synthesizer clock into a plurality of synthesizer clock components, wherein each of the plurality of synthesizer clock components is outputted into a clock port of a corresponding second DFFs;

a D port of each of the plurality of second DFFs is configured to receive a corresponding bit of the cycle difference index signal;

a Q port of each of the plurality of second DFFs is configured to output a corresponding bit of the parallel data signals.

7. The circuit according to claim 1, further comprising a generator for a plurality of phase-shifted signals, a plurality of digital time converter cells, a combined logic, and a second state machine, wherein the generator for the plurality of phase-shifted signals is configured to generate a plurality of clock component signals;

each of the plurality of digital time converter cells is connected to a corresponding output port of the generator for the plurality of phase-shifted signals, and is configured to receive a corresponding one of the plurality of clock component signals, delay the corresponding one of the plurality of clock component signals according to a control word, and output a corresponding output clock component signal, and the combined logic is connected to the plurality of digital time converter cells, and is configured to generate the synthesized clock signal by adding a plurality of output clock component signals;

the first state machine is further configured to calculate a jitter index according to the tuning signal;

wherein the second state machine is connected to the first state machine, and configured to adjust a control word of each of the plurality of digital time converter cells, so as to adjust the jitter index of the synthesized clock signal;

wherein the adjustment is completed when an adjusted jitter index equals to or is smaller than a predetermined jitter threshold, or when the jitter index gets its minimum value for a specific adjustment period.

8. A method, comprising:

receiving, by a cycle-cycle detector, a synthesized clock signal;

detecting, by the cycle-cycle detector, a cycle difference index signal between any two neighboring cycles of the synthesized clock signal, wherein the synthesized clock signal is combined by a plurality of phase shifted signals;

converting, by a Demultiplexer, the cycle difference index signal into a plurality of parallel data signals;

generating, by a first state machine, a tuning signal based on the parallel data signals, and feeding the tuning signal back to the cycle-cycle detector;

adjusting, by the cycle-cycle detector, a delay time of the synthesized clock signal according to the tuning signal; and generating, by a filter, filtered parallel data signals by filtering the plurality of parallel data signals, wherein the generating further comprises generating the tuning signal based on the filtered parallel data signals, and feeding the tuning signal back to the cycle-cycle detector.

9. The method according to claim 8, further comprising generating, by the first state machine, an order signal based on the parallel data signals; and regulating, by the Demultiplexer, the plurality of parallel data signals' sequence according to the order signal.

10. The method according to claim 8, wherein the detecting further comprises:

generating, by a digital time converter, a delayed clock signal by regulating the synthesized clock signal with the tuning signal; and receiving, by a timing arbiter, the synthesized clock signal and the delayed clock signal, and generating, by the timing arbiter, the cycle difference index signal, wherein the cycle difference index signal indicates a size relationship between the synthesized clock signal and the delayed clock signal.

11. The method according to claim 10, wherein the digital time converter comprises a first buffer, a second buffer and a variable capacitor, wherein generating, by the digital time converter, a delayed clock signal by regulating the synthesized clock signal with the tuning signal further comprises outputting the delayed clock signal by filtering a buffered signal outputted by the first buffer by the variable capacitor using the tuning signal.

12. The method according to claim 10, wherein the timing arbiter further comprises a first D-type flip flop (DFF),
wherein a clk port of the first DFF is configured to receive the synthesized clock signal, a D port of the first DFF is configured to receive the delayed clock signal, and a Q port of the first DFF is configured to output the cycle difference index signal.

13. The method according to claim 10, wherein the timing arbiter further comprises a first D-type flip flop (DFF),
wherein a clk port of the first DFF is configured to receive the delayed clock signal, a D port of the first DFF is configured to receive the synthesized clock signal, and a Q port of the first DFF is configured to output the cycle difference index signal.

14. The method according to claim 8, wherein the Demultiplexer comprises a divider and a plurality of second DFFs, wherein the cycle difference index signal comprises a plurality of bits; the method further comprises
dividing, by the divider, a received synthesizer clock into a plurality of synthesizer clock components,
outputting, each of the plurality of synthesizer clock components into a clock port of a corresponding second DFFs;
receiving, by a D port of each of the plurality of second DFFs, a corresponding bit of the cycle difference index signal;
outputting, by a Q port of each of the plurality of second DFFs, a corresponding bit of the parallel data signals.

15. The method according to claim 8, further comprising
generating, by a generator for a plurality of phase-shifted signals, a plurality of clock component signals;
receiving, by each of the plurality of digital time converter cells connected to a corresponding output port of the generator for the plurality of phase-shifted signals, a corresponding one of the plurality of clock component signals;
delaying, by each of the plurality of digital time converter cells, the corresponding one of the plurality of clock component signals according to a control word;
outputting, by each of the plurality of digital time converter cells, a corresponding output clock component signal;
generating, by a combined logic connected to the plurality of digital time converter cells, the synthesized clock signal by adding a plurality of output clock component signals;
calculating, by the first state machine, a jitter index according to the tuning signal;
adjusting, by a second state machine connected to the first state machine, a control word of each of the plurality of digital time converter cells, so as to adjust the jitter index;
wherein the adjustment is completed when an adjusted jitter index equals to or is smaller than a predetermined jitter threshold, or when the jitter index gets its minimum value for a specific adjustment period.

* * * * *